United States Patent
Yamazaki et al.

(10) Patent No.: US 9,240,525 B2
(45) Date of Patent: Jan. 19, 2016

(54) LIGHT-EMITTING DEVICE, LIGHTING DEVICE, AND ELECTRONIC DEVICE

(71) Applicant: Semiconductor Energy Laboratory Co., Ltd., Kanagawa-ken (JP)

(72) Inventors: Shunpei Yamazaki, Tokyo (JP); Kaoru Hatano, Kanagawa (JP); Masahiro Katayama, Tochigi (JP); Shingo Eguchi, Tochigi (JP); Yoshiaki Oikawa, Kanagawa (JP); Ami Nakamura, Tochigi (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 14/162,042

(22) Filed: Jan. 23, 2014

(65) Prior Publication Data
US 2014/0138711 A1    May 22, 2014

Related U.S. Application Data

(62) Division of application No. 12/824,795, filed on Jun. 28, 2010, now Pat. No. 8,766,269.

(30) Foreign Application Priority Data

Jul. 2, 2009    (JP) ................... 2009-157742

(51) Int. Cl.
*H01L 27/14*    (2006.01)
*H01L 29/04*    (2006.01)
(Continued)

(52) U.S. Cl.
CPC ............ *H01L 33/48* (2013.01); *H01L 51/5243* (2013.01); *H01L 51/5246* (2013.01);
(Continued)

(58) Field of Classification Search
CPC ............... H01L 27/14609; H01L 27/14689; H01L 27/1463; H01L 33/08
USPC ............. 257/72, 729, E23.121; 438/127, 155
See application file for complete search history.

(56) References Cited

U.S. PATENT DOCUMENTS

| 5,107,175 A | 4/1992 | Hirano et al. |
| 5,124,204 A | 6/1992 | Yamashita et al. |

(Continued)

FOREIGN PATENT DOCUMENTS

| EP | 1 111 574 A2 | 6/2001 |
| EP | 1122794 A | 8/2001 |

(Continued)

OTHER PUBLICATIONS

Kim, G.H. et al, "Thin Film Passivation for Longevity of Organic Light-Emitting Devices and Organic Thin-Film Transistor," IDW '03: Proceedings of the 10th International Display Workshops, Dec. 3, 2003, pp. 387-390.

(Continued)

*Primary Examiner* — Zandra Smith
*Assistant Examiner* — John M Parker
(74) *Attorney, Agent, or Firm* — Husch Blackwell LLP

(57) ABSTRACT

It is an object to provide a flexible light-emitting device with high reliability in a simple way. Further, it is an object to provide an electronic device or a lighting device each mounted with the light-emitting device. A light-emitting device with high reliability can be obtained with the use of a light-emitting device having the following structure: an element portion including a light-emitting element is interposed between a substrate having flexibility and a light-transmitting property with respect to visible light and a metal substrate; and insulating layers provided over and under the element portion are in contact with each other in the outer periphery of the element portion to seal the element portion. Further, by mounting an electronic device or a lighting device with a light-emitting device having such a structure, an electronic device or a lighting device with high reliability can be obtained.

26 Claims, 8 Drawing Sheets

(51) Int. Cl.
  *H01L 29/15*   (2006.01)
  *H01L 31/036*  (2006.01)
  *H01L 33/48*   (2010.01)
  *H01L 51/52*   (2006.01)
  *H05B 33/04*   (2006.01)
  *H05B 33/10*   (2006.01)
  *H05B 33/22*   (2006.01)
  *H01L 27/146*  (2006.01)
  *H01L 27/32*   (2006.01)
  *H01L 33/08*   (2010.01)

(52) U.S. Cl.
  CPC ............ *H01L51/5253* (2013.01); *H05B 33/04* (2013.01); *H05B 33/10* (2013.01); *H05B 33/22* (2013.01); *H01L 27/1463* (2013.01); *H01L 27/14609* (2013.01); *H01L 27/14689* (2013.01); *H01L 27/322* (2013.01); *H01L 27/3276* (2013.01); *H01L 33/08* (2013.01); *H01L 51/5278* (2013.01); *H01L 2227/323* (2013.01); *H01L 2251/5338* (2013.01); *H01L 2251/5361* (2013.01)

(56) References Cited

U.S. PATENT DOCUMENTS

| | | |
|---|---|---|
| 5,189,405 A | 2/1993 | Yamashita et al. |
| 5,686,360 A | 11/1997 | Harvey, III et al. |
| 5,693,956 A | 12/1997 | Shi et al. |
| 5,757,126 A | 5/1998 | Harvey, III et al. |
| 5,771,562 A | 6/1998 | Harvey, III et al. |
| 5,811,177 A | 9/1998 | Shi et al. |
| 5,952,778 A | 9/1999 | Haskal et al. |
| 6,146,225 A | 11/2000 | Sheats et al. |
| 6,150,187 A | 11/2000 | Zyung et al. |
| 6,198,217 B1 | 3/2001 | Suzuki et al. |
| 6,198,220 B1 | 3/2001 | Jones et al. |
| 6,239,470 B1 | 5/2001 | Yamazaki |
| 6,413,645 B1 | 7/2002 | Graff et al. |
| 6,441,468 B1 | 8/2002 | Yamazaki |
| 6,538,390 B2 * | 3/2003 | Fujita et al. ............... 315/169.3 |
| 6,548,960 B2 | 4/2003 | Inukai |
| 6,756,740 B2 | 6/2004 | Inukai |
| 6,781,152 B2 | 8/2004 | Yamazaki |
| 6,977,394 B2 | 12/2005 | Yamazaki et al. |
| 7,119,364 B2 | 10/2006 | Yamazaki |
| 7,190,115 B2 | 3/2007 | Tsuchiya et al. |
| 7,332,381 B2 | 2/2008 | Maruyama et al. |
| 7,446,336 B2 | 11/2008 | Yamazaki et al. |
| 7,486,368 B2 | 2/2009 | Sakakura et al. |
| 7,566,633 B2 | 7/2009 | Koyama et al. |
| 7,619,258 B2 | 11/2009 | Tsuchiya et al. |
| 7,648,862 B2 | 1/2010 | Maruyama et al. |
| 7,732,263 B2 * | 6/2010 | Yamazaki ............... G11C 17/12 257/21.413 |
| 7,906,784 B2 | 3/2011 | Koyama et al. |
| 7,915,689 B2 | 3/2011 | Cho et al. |
| 8,026,877 B2 | 9/2011 | Osame et al. |
| 8,039,288 B2 | 10/2011 | Yamazaki |
| 8,043,936 B2 | 10/2011 | Eguchi et al. |
| 8,048,770 B2 | 11/2011 | Eguchi et al. |
| 8,048,777 B2 | 11/2011 | Eguchi et al. |
| 8,058,083 B2 | 11/2011 | Eguchi et al. |
| 8,080,936 B2 | 12/2011 | Fujimura et al. |
| 8,159,127 B2 | 4/2012 | Izumi |
| 8,179,040 B2 | 5/2012 | Tsuchiya et al. |
| 8,367,440 B2 | 2/2013 | Takayama et al. |
| 8,382,545 B2 | 2/2013 | Sakakura et al. |
| 8,415,208 B2 | 4/2013 | Takayama et al. |
| 8,421,349 B2 | 4/2013 | Fujimura et al. |
| 8,466,482 B2 | 6/2013 | Yamazaki |
| 8,659,523 B2 | 2/2014 | Osame et al. |
| 8,901,806 B2 | 12/2014 | Sakakura et al. |
| 9,054,141 B2 | 6/2015 | Eguchi et al. |
| 2002/0012587 A1 | 1/2002 | Farrar et al. |
| 2002/0149320 A1 | 10/2002 | Maruyama et al. |
| 2005/0046346 A1 | 3/2005 | Tsuchiya et al. |
| 2005/0269943 A1* | 12/2005 | Hack et al. .................. 313/504 |
| 2006/0199461 A1* | 9/2006 | Yamazaki et al. ............ 445/24 |
| 2008/0088245 A1 | 4/2008 | Yamazaki et al. |
| 2008/0179594 A1 | 7/2008 | Oh |
| 2008/0303140 A1 | 12/2008 | Ohtani et al. |
| 2009/0023251 A1 | 1/2009 | Eguchi et al. |
| 2009/0302749 A1* | 12/2009 | Lee et al. .................... 313/504 |
| 2010/0148179 A1 | 6/2010 | Maruyama et al. |
| 2010/0201655 A1 | 8/2010 | Yamazaki et al. |
| 2013/0214324 A1 | 8/2013 | Takayama et al. |
| 2013/0249385 A1 | 9/2013 | Fujimura et al. |
| 2013/0277679 A1 | 10/2013 | Yamazaki |
| 2015/0017751 A1 | 1/2015 | Eguchi et al. |
| 2015/0129858 A1 | 5/2015 | Sakakura et al. |

FOREIGN PATENT DOCUMENTS

| | | |
|---|---|---|
| EP | 1 492 390 A2 | 12/2004 |
| EP | 1607931 A | 12/2005 |
| EP | 2261978 A | 12/2010 |
| EP | 2 280 390 A1 | 2/2011 |
| JP | 2001-242827 A | 9/2001 |
| JP | 2001-290439 A | 10/2001 |
| JP | 2003-174153 A | 6/2003 |
| JP | 2003-204049 | 7/2003 |
| JP | 2005-019082 | 1/2005 |
| JP | 2005-038842 A | 2/2005 |
| JP | 2005-079553 A | 3/2005 |
| JP | 2006-054111 A | 2/2006 |
| JP | 2006-270077 A | 10/2006 |
| JP | 2007-234431 A | 9/2007 |
| JP | 2008-109123 A | 5/2008 |
| JP | 2008-171021 A | 7/2008 |
| JP | 2010-153804 A | 7/2010 |
| JP | 2011-008969 A | 1/2011 |
| WO | WO 2004/057920 A1 | 7/2004 |

OTHER PUBLICATIONS

Chwang, A. et al, "64.2: Full Color 100 dpi AMOLED Displays on Flexible Stainless Steel Substrates," SID 06 Digest: SID International Symposium Digest of Technical Papers, vol. 37, Jun. 6, 2006, 1858-1861.

Jin, D.U. et al, "64.1: 5.6-Inch Flexible Full Color Top Emission AMOLED Display on Stainless Steel Foil," SID 06 Digest: SID International Symposium Digest of Technical Papers, vol. 37, Jun. 6, 2006, pp. 1855-1857.

\* cited by examiner

LIGHT-EMITTING DEVICE, LIGHTING DEVICE, AND ELECTRONIC DEVICE

This application is a divisional of copending application Ser. No. 12/824,795 filed on Jun. 28, 2010.

BACKGROUND OF THE INVENTION

1. Field of the Invention

The present invention relates to a light-emitting device including a light-emitting element utilizing electroluminescence (EL). Further, the present invention relates to a lighting device manufactured using the light-emitting device, or to an electronic device in which a display portion is mounted with the light-emitting device.

2. Description of the Related Art

In recent years, a light-emitting device to be mounted in a display of a television set, a mobile phone, a digital camera, or the like, or in a lighting device has been required to be flat and thin. A light-emitting device utilizing a self-luminous light-emitting element has attracted attention as a light-emitting device for meeting this requirement. One of the self-light-emitting elements is a light-emitting element utilizing electroluminescence, and this light-emitting element includes a light-emitting material interposed between a pair of electrodes and can provide light-emission from the light-emitting material by voltage application. Such a self-light-emitting element has a feature in that the thickness can be reduced and that response speed is extremely high.

In the next phase of this field, focus is placed on commercialization of a flexible light-emitting device having a curved surface, and a variety of proposals have been made (for example, see Patent Document 1). A light-emitting device using a flexible support substrate can be highly lightweight compared to the case of using a glass substrate or the like as a support substrate.

However, in commercialization of such a flexible light-emitting device, the biggest problem is its lifetime. The reason of the problem is that, in a flexible light-emitting device, a plastic substrate has to be used as a support substrate which needs to support a light-emitting element and to protect an element against moisture, oxygen, and the like in the outside thereof. The plastic substrate has high water permeability and low heat resistance, though it has flexibility. Because of the low heat resistance of the plastic substrate, a protective film with high quality which needs a high-temperature process cannot be formed, and moisture entering from the plastic substrate side has a great influence on the lifetime of the light-emitting element, furthermore, the light-emitting device.

In Non-Patent Document 1, for example, an example in which a light-emitting element is formed over a substrate including polyethersulfone (PES) as a base and is sealed with an aluminum film to form a flexible light-emitting device is introduced; however, its lifetime is about 230 hours and the light-emitting device is miles away from commercialization. In Non-Patent Documents 2 and 3, an example of a flexible light-emitting device in which a light-emitting element is formed over a stainless steel substrate is introduced. In this example, moisture and the like are prevented from entering from the stainless steel substrate side; however, moisture cannot be prevented effectively from entering from the light-emitting element side. Therefore, it is attempted to improve the lifetime with the use of, over the light-emitting element, a sealing film in which plural kinds of materials are stacked.

Although a thin metal film such as an aluminum film or a stainless steel substrate has both flexibility and low water permeability, it does not transmit visible light therethrough with a normal thickness. Thus, in the light-emitting device, a thin metal film or a stainless steel substrate is used for only one of a pair of substrates which sandwich a light-emitting element.

CITATION LIST

Patent Document

[Patent Document 1] Japanese Published Patent Application No. 2003-204049

Non-Patent Document

[Non Patent Document 1] Gi Heon Kim et al., IDW'03, 2003, pp. 387-390

[Non Patent Document 2] Dong Un Jin et al., SID 06 DIGEST, 2006, pp. 1855-1857

[Non Patent Document 3] Anna Chwang et al., SID 06 DIGEST, 2006, pp. 1858-1861

SUMMARY OF THE INVENTION

In view of the foregoing problem, it is an object of an embodiment of the present invention to provide a flexible light-emitting device with high reliability in a simple way. Further, it is an object to provide an electronic device or a lighting device each mounted with the light-emitting device.

The above problem can be solved with a light-emitting device having the following structure: an element portion including a light-emitting element is interposed between a substrate having flexibility and a light-transmitting property with respect to visible light and a metal substrate; and insulating layers provided over and under the element portion are in contact with each other in the outer periphery of the element portion to seal the element portion.

That is, an embodiment of the present invention is a light-emitting device including a substrate having flexibility and a light-transmitting property with respect to visible light; a first insulating layer provided over the substrate; an element portion which is provided over the first insulating layer and is provided with at least a light-emitting element and a switching element for applying a potential to the light-emitting element; a second insulating layer covering a side surface and a top surface of the element portion; and a metal substrate which is provided over the second insulating layer to face the substrate. In the light-emitting device, at least parts of the first insulating layer and the second insulating layer are in contact with each other in an outer periphery of the element portion.

An embodiment of the present invention is a light-emitting device including a substrate having flexibility and a light-transmitting property with respect to visible light; a first insulating layer provided over the substrate; an element portion which is provided over the first insulating layer and is provided with at least a light-emitting element and a switching element for applying a potential to the light-emitting element; a second insulating layer covering a side surface and a top surface of the element portion; a resin film provided over the second insulating layer; and a metal substrate which is provided over the resin film to face the substrate. In the light-emitting device, at least parts of the first insulating layer and the second insulating layer are in contact with each other in an outer periphery of the element portion.

In the above-described structure, a surface of the substrate which is opposite to a surface facing the light-emitting element may be provided with a third insulating layer.

An embodiment of the present invention is a light-emitting device including a substrate having flexibility and a light-transmitting property with respect to visible light; a first insulating layer provided over the substrate; an element portion which is provided over the first insulating layer and is provided with at least a light-emitting element and a switching element for applying a potential to the light-emitting element; a second insulating layer covering a side surface and a top surface of the element portion; a sealing material which is provided over the second insulating layer and is provided to surround an outer periphery of the element portion; and a metal substrate which is provided to face the substrate. In the light-emitting device, at least parts of the first insulating layer and the second insulating layer are in contact with each other in a region which is in an outer periphery of the element portion and is surrounded by the sealing material.

An embodiment of the present invention is an electronic device or a lighting device each mounted with a light-emitting device having the above-described structure.

Note that in this specification, the category of the term "light-emitting element" includes elements whose luminance is controlled by current or voltage, and specifically includes organic EL elements, inorganic EL elements, and the like.

The light-emitting device disclosed in this specification may be either a passive matrix light-emitting device or an active matrix light-emitting device.

The category of the light-emitting device in this specification includes image display devices, light emitting devices, and light sources (e.g., lighting devices). In addition, the category of the light-emitting device includes all types of modules such as a module in which a panel is attached with a connector such as an FPC (flexible printed circuit), a TAB (tape automated bonding) tape or a TCP (tape carrier package); a module in which a printed wiring board is provided on the tip of a TAB tape or a TCP; and a module in which an IC (integrated circuit) is directly mounted on a light-emitting element by the COG (chip on glass) technique.

Note that the ordinal numbers such as "first" and "second" in this specification are used for convenience and do not denote the order of steps and the stacking order of layers. In addition, the ordinal numbers in this specification do not denote particular names which specify the present invention.

In accordance with an embodiment of the present invention, a light-emitting device which has high reliability and is thinned can be provided. Further, in accordance with an embodiment of the present invention, a lighting device or an electronic device with high reliability can be provided with the use of a light-emitting device with high reliability.

DETAILED DESCRIPTION OF THE INVENTION

Embodiments of the present invention will be described below with reference to drawings. However, the present invention can be carried out in many different modes, and it is easily understood by those skilled in the art that modes and details of the present invention can be modified in various ways without departing from the purpose and the scope of the present invention. Therefore, the present invention is not construed as being limited to description of the embodiments.

Embodiment 1

Figure 1A:
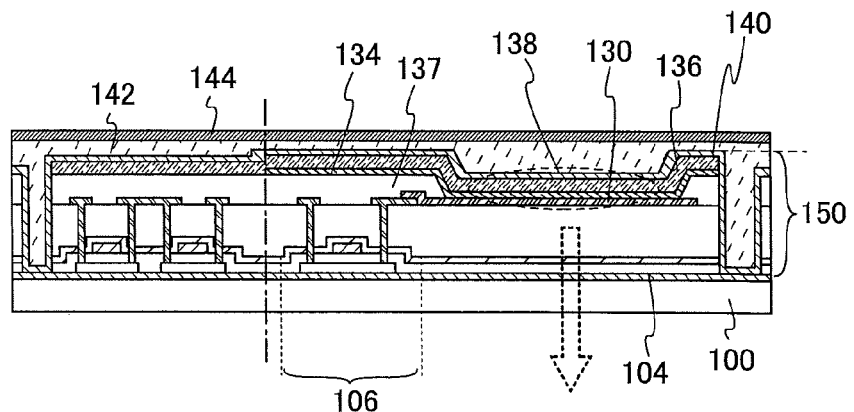
FIGS. 1A to 1C each illustrate a light-emitting device of an embodiment of the present invention.
Figure 1B:
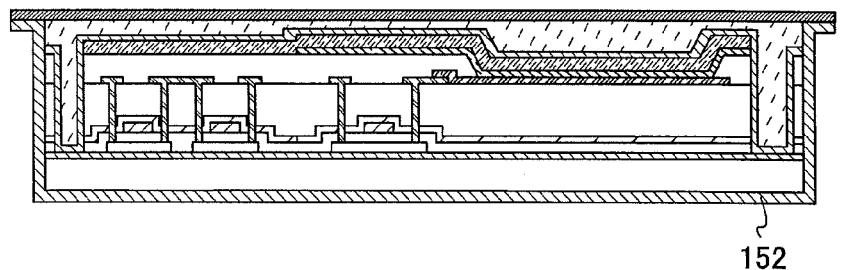
Figure 1C:
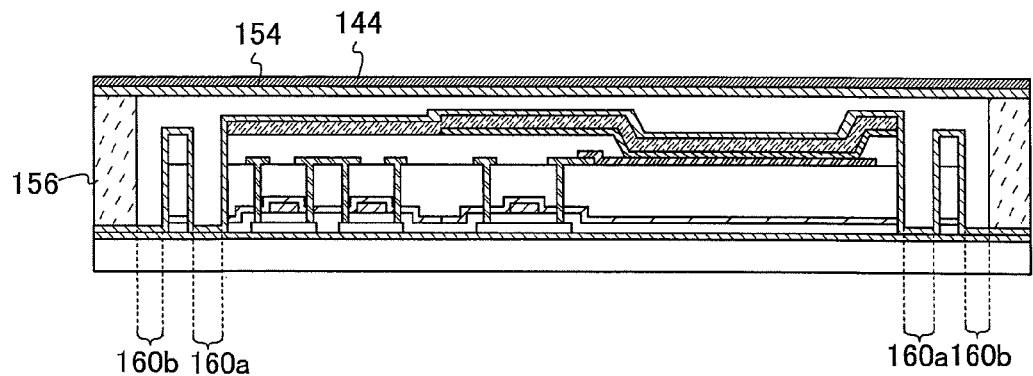

In this embodiment, examples of a light-emitting device will be described with reference to FIGS. 1A to 1C. FIGS. 1A to 1C each illustrate a display portion of a light-emitting device of this embodiment.

The light-emitting device of this embodiment which is illustrated in FIG. 1A includes an element portion 150 and a first insulating layer 104 over a substrate 100. A top surface and a side surface of the element portion 150 are covered with a second insulating layer 140. Further, at least parts of the first insulating layer 104 and the second insulating layer 140 are in contact with each other in end portions of the light-emitting device where the element portion 150 is not present, so that the element portion 150 is sealed. Note that it is preferable that the first insulating layer 104 and the second insulating layer 140 be in contact with each other so as to surround the outer periphery of the element portion 150, and it is still preferable that a region where the first insulating layer 104 and the second insulating layer 140 are in contact with each other goes around twice the outer periphery of the element portion 150. Further, a metal substrate 144 is provided to face the substrate 100, and a resin film 142 is provided between the metal substrate 144 and the second insulating layer 140.

As the substrate 100, a substrate having flexibility and a light-transmitting property with respect to visible light can be used, and for example, it is preferable to use a polyester resin such as polyethylene terephthalate (PET) or polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, a polyvinylchloride resin, or the like. Alternatively, as the substrate 100, a structure body in which a fibrous body is impregnated with an organic resin can be used. However, as the substrate 100, any substrate having flexibility and a light-transmitting property with respect to visible light can be used without particular limitation.

The first insulating layer 104 is formed over the substrate 100. The first insulating layer 104 serves as a protective layer, so that moisture and gas such as oxygen can be prevented from entering the element portion 150. Further, a semiconductor element or a wiring can be prevented from being damaged (e.g., the semiconductor element or the wiring can be prevented from being cracked) in separating an element portion including the semiconductor element and the like from a substrate for element formation with the use of a separation layer in a process of manufacturing a light-emitting device. The first insulating layer 104 is formed using a material having a light-transmitting property and low water permeability. For example, a material containing nitrogen and silicon, such as silicon nitride, silicon nitride oxide, or silicon oxynitride, can be preferably used. The first insulating layer 104 may be formed as a single layer or a multilayer. The first insulating layer 104 is preferably formed to a thickness of 10 nm to 1000 nm inclusive, and still preferably a thickness of 100 nm to 700 nm inclusive.

The element portion 150 is formed over the first insulating layer 104. The element portion 150 includes at least a light-emitting element 138 and a switching element for applying a potential to the light-emitting element 138. For example, a transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), a thyristor, or the like can be used as the switching element. Alternatively, a logic circuit in which such elements are combined can be used as the switching element. In this embodiment, a thin film transistor 106 is used as the switching element. Further, a light-emitting device may be a driver integrated type light-emitting device, so that a driver circuit portion may be included in the element portion 150. Note that a driver circuit can be formed outside the substrates which are sealed.

The light-emitting element 138 includes a first electrode 130 serving as a pixel electrode, partition walls 137 covering end portions of the first electrode, an EL layer 134, and a second electrode 136. One of the first electrode 130 and the second electrode 136 serves as an anode and the other thereof serves as a cathode.

The EL layer 134 included in the light-emitting element includes at least a light-emitting layer. Further, the EL layer 134 can have a stacked-layer structure including any of functional layers such as a hole injection layer, a hole transport layer, an electron transport layer, an electron injection layer, and the like, in addition to the light-emitting layer. The EL layer 134 can be formed using either a low molecular material or a high molecular material. Note that the material forming the EL layer 134 is not limited to a material containing only an organic compound material, and may partially contain an inorganic compound material.

The top surface and the side surface of the element portion 150 including the light-emitting element 138 are covered with the second insulating layer 140. Further, at least the parts of the first insulating layer and the second insulating layer are in contact with each other in the end portions of the light-emitting device where the element portion 150 is not present, so that the element portion 150 is sealed.

The second insulating layer 140 serves as a protective layer, so that moisture and gas such as oxygen can be prevented from entering the element portion 150. The second insulating layer 140 is formed using a material having a light-transmitting property and low water permeability. For example, a material containing nitrogen and silicon, such as silicon nitride, silicon nitride oxide, or silicon oxynitride; aluminum oxide; or the like can be preferably used. The second insulating layer 140 may be formed as a single layer or a multilayer. The second insulating layer 140 is preferably formed to a thickness of 10 nm to 1000 nm inclusive, and still preferably a thickness of 100 nm to 700 nm inclusive.

In FIG. 1A, the resin film 142 is formed over the second insulating layer 140. Examples of materials used for formation of the resin film 142 include an organic compound such as acrylic resins, polyimide resins, melamine resins, polyester resins, polycarbonate resins, phenol resins, epoxy resins, polyacetal, polyether, polyurethane, polyamide (nylon), furan resins, or diallylphthalate resins; inorganic siloxane polymers including a Si—O—Si bond among compounds including silicon, oxygen, and hydrogen, formed by using a siloxane-polymer-based material typified by silica glass as a starting material; or organic siloxane polymers in which hydrogen bonded with silicon is substituted by an organic group such as methyl or phenyl, typified by alkylsiloxane polymers, alkylsilsesquioxane polymers, silsesquioxane hydride polymers, or alkylsilsesquioxane hydride polymers. Alternatively, as the resin film 142, a structure body in which a fibrous body is impregnated with an organic resin can be used.

The metal substrate 144 facing the substrate 100 is provided over the resin film 142. The metal substrate 144 employed has a thickness of 10 μm to 200 μm inclusive so as to be flexible. A material of the metal substrate 144 is not limited to a particular material, but it is preferable to use aluminum, copper, nickel, an alloy such as an aluminum alloy or stainless steel, or the like. Since the metal substrate 144 does not have a light-transmitting property with respect to visible light with a thickness in the above range although it has sufficiently low water permeability and sufficiently high flexibility, the light-emitting device in this embodiment is a so-called bottom emission light-emitting device in which light emission is extracted through the substrate 100 provided with a thin film transistor layer.

Note that a drying agent may be provided between the resin film 142 and the metal substrate 144. By enclosing the drying agent therebetween, deterioration of the light-emitting element due to moisture and the like can be further prevented. As the drying agent, a substance which adsorbs moisture by chemical adsorption, such as an oxide of an alkaline earth metal such as calcium oxide or barium oxide can be used. Alternatively, a substance which adsorbs moisture by physical adsorption such as zeolite or silica gel may be used as well, as the drying agent.

The light-emitting device of this embodiment which is illustrated in FIGS. 1A to 1C can be curved. Therefore, the light-emitting device of this embodiment can be bonded to various base materials. When the light-emitting device of this embodiment is attached to a base material having a curved surface, an electronic device such as a display having a curved surface or a lighting device having a curved surface can be realized.

Further, in the light-emitting device of this embodiment, the top surface and the side surface of the element portion 150 are covered with the second insulating layer 140 formed using a film having low water permeability. In addition, in the light-emitting device of this embodiment, the second insulating layer 140 is in contact with the first insulating layer 104 in the end portions of the element portion 150, so that the element portion 150 is sealed. Thus, moisture and gas such as oxygen can be prevented from entering the element portion 150. Accordingly, a highly reliable light-emitting device in which deterioration due to moisture or gas is suppressed can be obtained.

FIG. 1B illustrates a light-emitting device of this embodiment whose structure is different from the structure illustrated in FIG. 1A. The light-emitting device of this embodiment which is illustrated in FIG. 1B has a structure in which a third insulating layer 152 is provided outside the substrate 100 (the side opposite to the light-emitting element 138) in the light-emitting device illustrated in FIG. 1A.

In the light-emitting device illustrated in FIG. 1B, moisture and gas such as oxygen can be prevented from entering from the substrate 100 side more effectively with the third insulating layer 152. Further, a surface of the substrate 100 which is a soft substrate formed using resin or the like can be prevented from being scratched and can be protected against pressures applied thereto, for example.

The third insulating layer 152 is formed as a single layer or a multilayer using an inorganic compound by a sputtering method, a plasma CVD method, an application method, a printing method, or the like after the attachment of the metal substrate 144. The third insulating layer 152 is preferably formed using a film having a transmitting property with respect to visible light and a high degree of hardness. For example, a film containing nitrogen and silicon, such as a silicon nitride film or a silicon nitride oxide film, can be preferably used. The third insulating layer 152 is preferably formed to a thickness of 10 nm to 1000 nm inclusive, and still preferably a thickness of 100 nm to 700 nm inclusive. Note that by the formation of the third insulating layer 152 in succession to the attachment of the metal substrate 144, the light-emitting element is not exposed to the air; therefore, the light-emitting element can be prevented from deteriorating.

FIG. 1C illustrates a light-emitting device of this embodiment whose structure is different from the structures illustrated in FIG. 1A and FIG. 1B.

The light-emitting device of this embodiment which is illustrated in FIG. 1C is an example of bonding the metal substrate 144 with the use of a sealing material 156 surrounding the outer periphery of the element portion over the second insulating layer 140, instead of using the resin film 142 covering the element portion 150 in the light-emitting device illustrated in FIG. 1A. In FIG. 1C, the sealing material 156 can be formed using a thermal curable epoxy resin, a UV curable acrylic resin, thermoplastic nylon, polyester, or the like by a dispenser method, a printing method, a thermo-compression bonding method, or the like. Note that a drying agent may be provided in a region surrounded by the sealing material.

In the light-emitting device illustrated in FIG. 1C, a surface of the metal substrate 144 facing the element portion 150 is provided with an insulating film 154. The insulating film 154 can be formed to have a single-layer structure or a stacked-layer structure using an inorganic material such as an oxide of silicon or a nitride of silicon; an organic material such as polyimide, polyamide, benzocyclobutene, acrylic, or epoxy; a siloxane material; or the like, by a CVD method, a sputtering method, a SOG method, a droplet discharge method, a screen printing method, or the like.

The insulating film 154 can prevent moisture and gas such as oxygen from entering the light-emitting device more effectively because the adhesion to the sealing material 156 is improved. Note that in the case where the metal substrate 144 is provided with the insulating film 154, the insulating film 154 is preferably formed after a surface of the metal substrate 144 is subjected to the etching treatment.

Further, in FIG. 1C, two pairs of groove portions (a first groove portion 160a and a second groove portion 160b) are provided in the end portions of the element portion 150. In each groove portion, the first insulating layer 104 and the second insulating layer 140 are in contact with each other, so that the element portion 150 is sealed. Note that it is preferable that the first groove portion 160a and the second groove portion 160b be each formed to surround the outer periphery of the element portion 150. With the two pairs of groove portions provided in the end portions of the element portion 150 as illustrated in FIG. 1C, stress which is to be applied to the element portion 150 when the light-emitting device is bended can be relieved. Thus, a light-emitting device having high resistance to bending can be obtained.

Note that the structures illustrated in FIGS. 1A to 1C can be used in combination.

Further, in FIGS. 1A to 1C, a driver circuit portion may be included in the element portion 150. Furthermore, in FIGS. 1A to 1C, only one light-emitting element 138 is illustrated; however, in the case where the light-emitting device in this embodiment is used for displaying an image, a pixel portion including a plurality of the light-emitting elements 138 is formed. When a full-color image is displayed, it is necessary to obtain light of at least three colors, i.e., red, green, and blue. As a method for obtaining light of at least three colors, there are a method in which a necessary portion of each EL layer 134 is formed using an appropriate material in accordance with the color of light emission, a method in which each color is obtained by forming all light-emitting elements for emitting light of white and transmitting the light through a color filter layer, a method in which each color is obtained by forming all light-emitting elements for emitting light of blue or other colors with a shorter wavelength than blue and transmitting the light through a color conversion layer, and the like.

FIGS. 2A to 2D each illustrate an example of how a color filter layer or a color conversion layer is placed. In FIGS. 2A to 2D, reference numeral 200 denotes a color filter layer (or a color conversion layer). The color filter layer (or the color conversion layer) 200 is provided for the light-emitting element 138 of each color. And the color filter layers of adjacent colors may be overlapped at a portion other than an open region (a portion where the first electrode, the EL layer, and the second electrode are directly overlapped) of the light-emitting element 138. The color filter layer 200 may be formed in only a pixel portion 250 or in a region including a driver circuit portion 252. Note that the driver circuit portion 252 may be provided outside the light-emitting device.

Figure 2A:
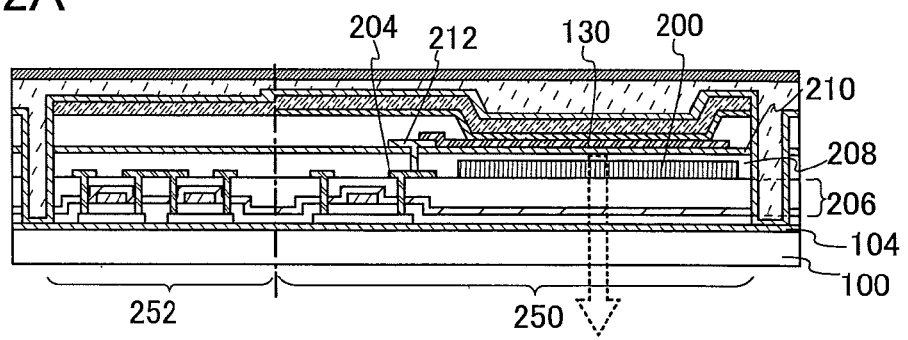
FIGS. 2A to 2D each illustrate a light-emitting device of an embodiment of the present invention.

FIG. 2A illustrates an example of forming the color filter layer 200 over a first interlayer insulating film 206 after a wiring 204 of a thin film transistor is formed, and of forming a second interlayer insulating film over the color filter layer 200.

The second interlayer insulating film can be formed to have a single-layer structure or a stacked-layer structure using an organic insulating material such as polyimide, polyamide, benzocyclobutene, acrylic, or epoxy, or an inorganic insulating material such as an oxide of silicon or a nitride of silicon, for example. As illustrated in FIG. 2A, a planarization film 208 which planarizes a step due to a color filter is formed using an organic insulating material, and then, a barrier film 210 using an inorganic insulating material is stacked over the planarization film 208. Thus, the second interlayer insulating film can be formed. With the barrier film 210, the light-emitting element can be prevented from being affected by gas generated from the color filter layer (or the color conversion layer) 200, which is preferable. Note that as the second interlayer insulating film, a multilayer in which a number of organic insulating materials and inorganic insulating materials are alternately stacked may be used.

In FIG. 2A, after the second interlayer insulating film is formed, a contact hole is formed in the planarization film 208. In addition, an electrode 212 connecting the first electrode 130 of the light-emitting element and the wiring 204 is formed, and the first electrode 130 of the light-emitting element is provided.

Although FIGS. 2A to 2D each illustrate only a color filter (or a color conversion layer) of a single color, color filters (or color conversion layers) of red, green, and blue are formed at appropriate positions with appropriate shapes in a light-emitting device. Any arrangement can be adopted for the arrangement pattern of the color filters (or the color conversion layers), and stripe arrangement, diagonal mosaic arrangement, triangle mosaic arrangement, and the like may be used. In addition, in the case of using a white-light-emitting element and a color filter, RGBW four pixel arrangement may be used. The RGBW four pixel arrangement is pixel arrangement which has a pixel provided with a color filter transmitting light of red, a pixel provided with a color filter transmitting light of blue, a pixel provided with a color filter layer transmitting light of green, and a pixel not provided with a color filter layer; this arrangement is effective in reducing power consumption and the like. Light emitted from the white-light-emitting element includes, for example, light of red, light of green, and light of blue, preferably, those according to the National Television Standards Committee (NTSC).

The color filter can be formed by using a known material. In the case of using a photosensitive resin as the color filter, the color filter layer may be patterned by exposing the color filter itself to light and then developing it, but it is preferred to perform patterning by dry etching since a minute pattern is necessary.

Figure 2B:
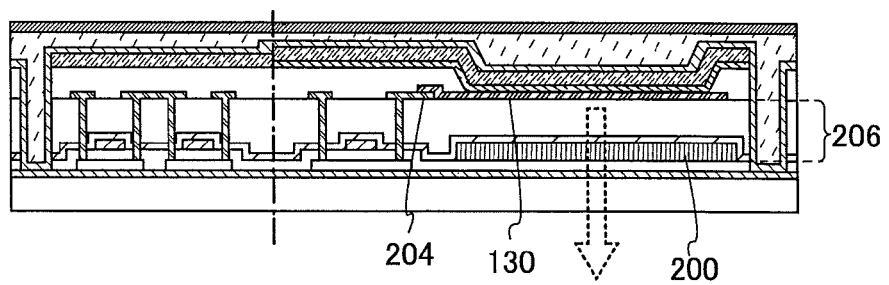

FIG. 2B illustrates an example of forming the color filter layer 200 after the formation of a thin film transistor, and forming the first interlayer insulating film 206 over the color filter layer 200. In FIG. 2B, after the first interlayer insulating film 206 is formed, a contact hole is formed in the first interlayer insulating film 206, and the wiring 204 is formed. Then, the first electrode 130 of the light-emitting element which is connected to the wiring 204 is provided.

Figure 2C:
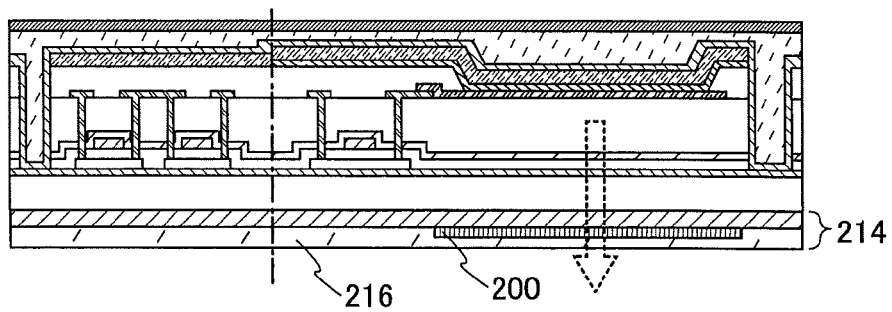

FIG. 2C illustrates an example of a structure in which a color filter substrate 214 provided with the color filter layer 200 is placed. In the case where a surface of the color filter substrate 214, which is not provided with the color filter layer 200, is attached to the substrate 100 with an adhesive, the color filter substrate 214 may be provided with a coat film 216 for preventing the color filter layer 200 from being scratched, for example. In addition, although not illustrated, a surface of the color filter substrate 214, which is provided with the color filter layer 200, may be attached to the substrate 100. Note that the color filter substrate 214 is a substrate obtained by forming the color filter layer 200 on any of various types of substrates having flexibility and a transmitting property with respect to visible light, for example, a substrate formed using a material similar to that for the substrate 100.

Figure 2D:
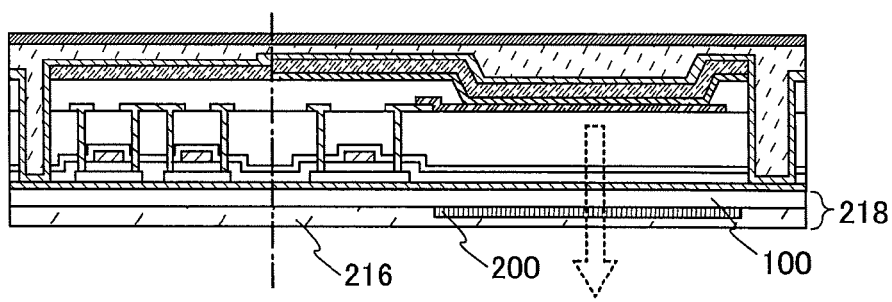

FIG. 2D illustrates an example of a structure in which a color filter substrate 218 where the substrate 100 is provided with the color filter layer 200 in advance is directly attached to a layer which is separated from a formation substrate. The color filter substrate 218 including the substrate 100 provided with the color filter layer 200 is directly attached to the layer including the first electrode, whereby the number of components can be reduced and the manufacturing cost can be reduced. As the above, how the color filter layer (or the color conversion layer) is placed is briefly described. In addition to the above, a black matrix may be provided between light-emitting elements, or other known structures may be employed.

Note that the structures in each of which a color filter layer is provided in the structure of the light-emitting device in FIG. 1A are illustrated as examples with the use of FIGS. 2A to 2D. However, these structures are applicable to the light-emitting device illustrated in FIG. 1B or FIG. 1C in a similar manner.

Note that the structure described in this embodiment can be combined with any of the structures described in other embodiments as appropriate.

Embodiment 2

An example of a method for manufacturing a light-emitting device an embodiment of which is shown in Embodiment 1 is described with reference to FIGS. 3A to 3C, FIGS. 4A to 4D, and FIGS. 5A and 5B. In this embodiment, the case of manufacturing the structure of the light-emitting device illustrated in FIG. 1A is described as an example.

First, a separation layer 302 is formed over a substrate 300 having an insulating surface, which is a formation substrate, and subsequently, the first insulating layer 104 is formed. The separation layer 302 and the first insulating layer 104 can be formed in succession. By forming successively, the surface of the separation layer 302 is not exposed to the air, so that impurities can be prevented from being contained in the separation layer 302 and the first insulating layer 104.

As the substrate 300, which is a formation substrate, a glass substrate, a quartz substrate, a sapphire substrate, a ceramic substrate, a metal substrate having an insulating layer on a surface thereof, or the like can be used. Alternatively, a plastic substrate having heat resistance to the processing temperature of this embodiment may be used. In the manufacturing process of a semiconductor device, a formation substrate can be selected as appropriate in accordance with the process.

Note that in this process, the case where the separation layer 302 is provided on an entire surface of the substrate 300 is described; however, after the separation layer 302 may be provided on the entire surface of the substrate 300 if needed, the separation layer 302 may be removed selectively, whereby the separation layer may be provided only on a desired region. In addition, although the separation layer 302 is formed to be in contact with the substrate 300 in FIGS. 3A to 3C, an insulating layer such as a silicon oxide film, a silicon oxynitride film, a silicon nitride film, or a silicon nitride oxide film may be formed to be in contact with the substrate 300, if needed, and then the separation layer 302 may be formed to be in contact with the insulating layer.

The separation layer 302 is formed to have a single-layer structure or a stacked-layer structure including a layer formed using an element such as tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), or silicon (Si); or an alloy material or a compound material containing any of the elements as its main component by a sputtering method, a plasma CVD method, an application method, a printing method, or the like. A crystalline structure of a layer containing silicon may be any one of an amorphous structure, a microcrystalline structure, and a polycrystalline structure. Note that an application method includes a spin-coating method, a dispensing method and the like in its category here.

In the case where the separation layer 302 has a single-layer structure, it is preferable to form a tungsten layer, a molybdenum layer, or a layer containing a mixture of tungsten and molybdenum. Alternatively, a layer containing an oxide or an oxynitride of tungsten, a layer containing an oxide or an oxynitride of molybdenum, or a layer containing an oxide or an oxynitride of a mixture of tungsten and molybdenum is formed. Note that the mixture of tungsten and molybdenum corresponds to an alloy of tungsten and molybdenum, for example.

In a case where the separation layer 302 has a stacked-layer structure, a tungsten layer, a molybdenum layer, or a layer containing a mixture of tungsten and molybdenum is preferably formed as a first layer. An oxide of tungsten, molybdenum, or a mixture of tungsten and molybdenum; a nitride of tungsten, molybdenum, or a mixture of tungsten and molybdenum; an oxynitride of tungsten, molybdenum, or a mixture of tungsten and molybdenum; or a nitride oxide of tungsten, molybdenum, or a mixture of tungsten and molybdenum is preferably formed as a second layer.

In the case where the stacked-layer structure of a layer containing tungsten and a layer containing an oxide of tungsten is formed as the separation layer 302, the layer containing tungsten may be formed first, which is followed by the formation of an insulating layer formed using an oxide over the layer containing tungsten so that a layer containing an oxide of tungsten is formed at the interface between the tungsten layer and the insulating layer. Further, the surface of the layer containing tungsten may be subjected to thermal oxidation treatment, oxygen plasma treatment, or treatment using a strong oxidizing solution such as ozone water to form a layer containing an oxide of tungsten. The plasma treatment and the thermal treatment may be performed in an atmosphere of oxygen, nitrogen, or dinitrogen monoxide alone, or a mixed gas of any of these gasses and another gas. The same can be applied to the case of forming a layer containing a nitride, an oxynitride, or a nitride oxide of tungsten. After a layer containing tungsten is formed, a silicon nitride layer, a silicon oxynitride layer, or a silicon nitride oxide layer may be formed thereover.

The first insulating layer 104 is preferably formed as a single layer or a multilayer of an insulating film containing nitrogen and silicon, such as silicon nitride, silicon oxynitride, or silicon nitride oxide. Further, the first insulating layer 104 can be formed by a sputtering method, a plasma CVD method, an application method, a printing method, or the like. For example, the first insulating layer 104 is formed at a temperature of 250° C. to 400° C. by a plasma CVD method, whereby a dense film having very low water permeability can be obtained. Note that the first insulating layer 104 is preferably formed to a thickness of 10 nm to 1000 nm inclusive, and still preferably a thickness of 100 nm to 700 nm inclusive. The first insulating layer 104 facilitates separation at the interface with the separation layer 302 in a subsequent separation step. Further, the semiconductor element or the wiring can be prevented from being cracked or damaged in the subsequent separation step. Further, the first insulating layer 104 serves as a protective layer of a light-emitting device to be manufactured.

Figure 3A:
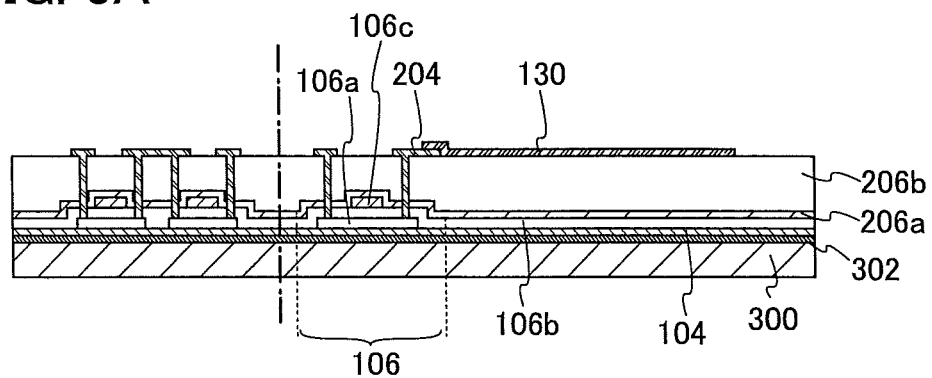
FIGS. 3A to 3C illustrate a method for manufacturing a light-emitting device of an embodiment of the present invention.

Next, the thin film transistor 106 is formed over the first insulating layer 104 (FIG. 3A). The thin film transistor 106 includes a semiconductor layer 106a having at least a source region, a drain region, and a channel formation region; a gate insulating layer 106b; and a gate electrode 106c. Note that in order to stabilize characteristics of the thin film transistor, a base insulating film may be formed between the first insulating layer 104 and the semiconductor layer 106a. The base insulating film can be formed as a single layer or a multilayer by using an inorganic insulating film of silicon oxide, silicon nitride, silicon oxynitride, silicon nitride oxide, or the like.

The semiconductor layer 106a is a layer formed using a non-single-crystal semiconductor which has a thickness of 10 nm to 100 nm inclusive, preferably, 20 nm to 70 nm inclusive. As the non-single-crystal semiconductor layer, a crystalline semiconductor layer, an amorphous semiconductor layer, a microcrystalline semiconductor layer, and the like can be given. As the semiconductor, silicon, germanium, a silicon germanium compound, or the like can be given. In particular, it is preferable to apply a crystalline semiconductor which is formed by crystallization through laser irradiation, rapid thermal annealing (RTA), heat treatment using an annealing furnace, or a method in which any of these methods are combined. In the heat treatment, a crystallization method using a metal element such as nickel which can promote crystallization of a silicon semiconductor can be used.

The gate insulating layer 106b is formed using an inorganic insulator such as silicon oxide or silicon oxynitride to a thickness of 5 nm to 200 nm inclusive, preferably 10 nm to 100 nm inclusive.

The gate electrode 106c can be formed using metal or a polycrystalline semiconductor doped with an impurity which has one conductivity type. In a case of using metal, tungsten (W), molybdenum (Mo), titanium (Ti), tantalum (Ta), aluminum (Al), or the like can be used. Moreover, metal nitride obtained by nitriding metal can be used. Alternatively, a structure in which a first layer formed using the metal nitride and a second layer formed using the metal are stacked may be used. At this time, by forming the first layer using metal nitride, the first layer can serve as a barrier metal. In other words, the metal of the second layer can be prevented from diffusing into the gate insulating layer or into the semiconductor layer that is provided in a layer lower than the gate insulating layer. In the case of employing a stacked-layer structure, the gate electrode may have a shape in which the edge of the first layer extends beyond the edge of the second layer.

For the thin film transistor 106 which is formed by combining the semiconductor layer 106a, the gate insulating layer 106b, the gate electrode 106c, and the like, various structures such as a single drain structure, an LDD (Lightly-Doped Drain) structure, and a gate-overlapped drain structure can be applied. Moreover, a multi-gate structure which is equivalent to a structure where transistors, to which gate voltage having the same potential is applied, are serially connected; a dual-gate structure where the semiconductor layer is sandwiched by gate electrodes; a bottom-gate structure; or the like can be used.

Further, a thin film transistor using metal oxide or an organic semiconductor material for a semiconductor layer may be used as the thin film transistor 106. As typical examples of the metal oxide, zinc oxide, an oxide of zinc gallium indium, and the like can be given.

Next, the wiring 204 which is electrically connected to the source region and the drain region of the thin film transistor 106 is formed, and the first electrode 130 of the light-emitting element which is electrically connected to the wiring 204 and serves as a pixel electrode is formed. For example, a first interlayer insulating film is formed as a single layer or a multilayer to cover the thin film transistor 106, and the wiring 204 which may serve as either the source electrode or the drain electrode is formed over the first interlayer insulating film. In FIG. 3A, the first interlayer insulating film 206 including two layers, insulating layers 206a and 206b, is formed. Then, the first electrode 130 which is connected to the wiring 204 is formed. Note that a second interlayer insulating film may be formed over the wiring 204, and the first electrode may be formed over the second interlayer insulating film.

The first interlayer insulating film 206 can be formed to have a single-layer structure or a stacked-layer structure using an inorganic material such as an oxide of silicon or a nitride of silicon; an organic material such as polyimide, polyamide, benzocyclobutene, acrylic, or epoxy; a siloxane material; or the like, by a CVD method, a sputtering method, a SOG method, a droplet discharge method, a screen printing method, or the like. For example, a silicon nitride oxide film may be formed as the first insulating layer 206a, and a silicon oxynitride film may be formed as the second insulating layer 206b.

The wiring 204 preferably includes a combination of a low resistant material like aluminum (Al) and a barrier metal using a metal material having a high melting point such as titanium or molybdenum, for example a stacked-layer structure of titanium (Ti) and aluminum (Al), molybdenum (Mo) and aluminum (Al), or the like.

The first electrode 130 is an electrode that is used as an anode or a cathode of the light-emitting element. In the case of being used as the anode, a material with a high work function is preferably used. For example, a single-layer film such as an indium tin oxide film, an indium tin oxide film containing silicon, a light-transmitting conductive film formed by a sputtering method using a target in which indium oxide is mixed with zinc oxide (ZnO) of 2 to 20 wt %, a zinc oxide (ZnO) film, a conductive oxynitride film containing zinc and aluminum, a titanium nitride film, a chromium film, a tungsten film, a Zn film, or a Pt film; a stacked-layer structure of a titanium nitride film and a film containing aluminum as its main component; a three-layer structure of a titanium nitride film, a film containing aluminum as its main component, and another titanium nitride film; or the like can be used. When the anode has a stacked-layer structure, the anode can have low resistance as a wiring and form a favorable ohmic contact.

In the case of being used as the cathode, a material with a low work function (Al, Ag, Li, Ca, or an alloy thereof such as MgAg, MgIn, AlLi, $CaF_2$, or calcium nitride) is preferably used. In the case where an electrode used as the cathode is made to transmit light, a stack of a thin metal film with a small thickness and a light-transmitting conductive film (an indium tin oxide film, an indium tin oxide film containing silicon, a light-transmitting conductive film formed by a sputtering method using a target in which indium oxide is mixed with zinc oxide (ZnO) of 2 to 20 wt %, a zinc oxide (ZnO) film, or the like) is preferably used as the electrode.

Figure 3B:
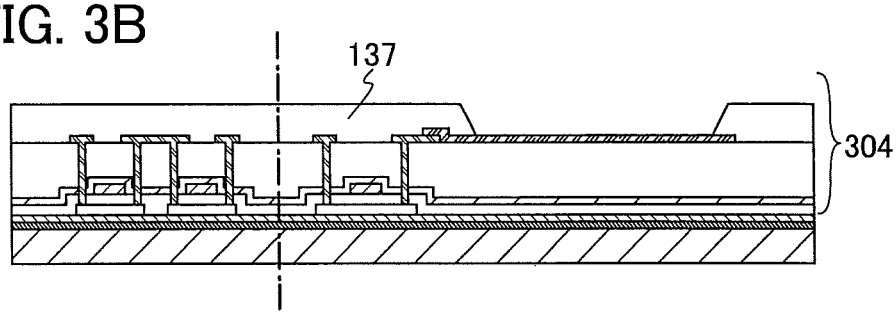

Next, the partition walls 137 are formed using an organic material or an inorganic material to cover the end portions of the first electrode 130 (FIG. 3B). For example, the partition walls 137 can be formed using positive photosensitive polyimide. The partition walls 137 are each formed to have a curved surface with a curvature at an upper end portion or a lower end portion thereof to ensure a favorable coverage by the films which are formed over the partition walls 137 later. Either a negative type which becomes insoluble in an etchant by light irradiation or a positive type which becomes soluble in an etchant by light irradiation can be used as the partition walls 137. Alternatively, the partition walls 137 can be formed to have a single-layer structure or a stacked-layer structure of an organic material such as epoxy, polyimide, polyamide, polyvinylphenol, or benzocyclobutene, or a siloxane material such as a siloxane resin.

In addition, the partition walls 137 can be subjected to plasma treatment to be oxidized or nitrided; accordingly, a surface of the partition walls 137 can be modified and thus a dense film can be obtained. By modifying the surface of the partition walls 137, the strength of the partition walls 137 can be improved, and physical damage such as crack generation at the time of forming an opening portion or the like or film reduction at the time of etching can be reduced.

Through the above process, an element formation layer 304 which is to be separated can be formed.

Figure 3C:
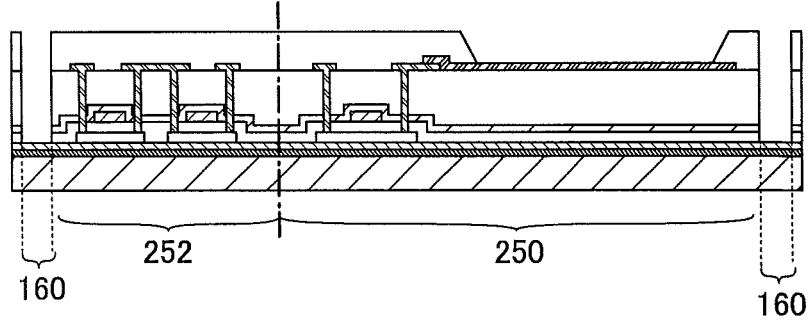

Next, the insulating layer provided in the end portions of the substrate 300 is removed by etching or the like to form a groove portion 160 so as to surround the outer periphery of the pixel portion 250 and the driver circuit portion 252 (a region to be the element portion of the light-emitting device) (FIG. 3C). In FIG. 3C, the partition walls 137, the first interlayer insulating film 206, and the gate insulating layer 106b are etched to expose the first insulating layer 104. Note that the groove portion 160 may be formed to expose the film containing nitrogen and silicon. In the case where the first interlayer insulating film 206 or the gate insulating layer 106b is formed using the above materials, these films are not necessarily etched. Two or more groove portions 160 which surround the outer periphery of the pixel portion 250 and the driver circuit portion 252 may be formed.

Figure 4A:
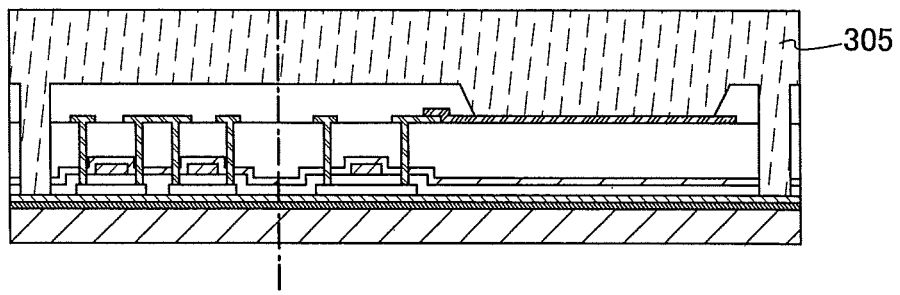
FIGS. 4A to 4D illustrate the method for manufacturing the light-emitting device of an embodiment of the present invention.

Next, as illustrated in FIG. 4A, an adhesive sheet 305 is attached to the element formation layer 304. For the adhesive sheet 305, a sheet which can be separated by light or heat is used. The adhesive sheet 305 is attached, whereby stress that is applied to the element formation layer 304 before and after separation can be reduced and damage to the thin film transistor 106 can be suppressed, as well as separation can be easily performed.

Figure 4B:
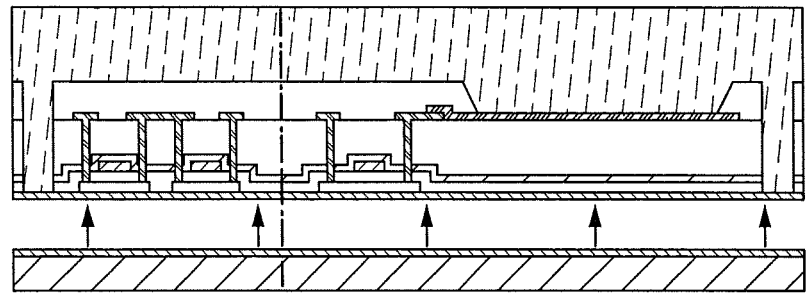

Next, the element formation layer 304 including the thin film transistor 106 and the like is separated from the substrate 300 (FIG. 4B). As a separation method, any of various methods can be employed. For example, when a metal oxide layer is formed as the separation layer 302 on the side that is in contact with the first insulating layer 104, the metal oxide layer is weakened by crystallization so that the element formation layer 304 can be separated from the substrate 300. In addition, when a light-transmitting substrate is used as the substrate 300 and a film containing nitrogen, oxygen, hydrogen, or the like (e.g., an amorphous silicon film containing hydrogen, an alloy containing hydrogen, an alloy containing oxygen, or the like) is used as the separation layer 302, the separation layer 302 is irradiated with laser beam through the substrate 300, and nitrogen, oxygen, or hydrogen contained in the separation layer is evaporated so that the element formation layer 304 can be separated from the substrate 300. Alternatively, the separation layer 302 may be etched to be removed such that the element formation layer 304 can be separated from the substrate 300.

Alternatively, a method of removing the substrate 300 by mechanical grinding or a method of removing the substrate 300 by etching using a halogen fluoride gas such as $NF_3$, $BrF_3$, $ClF_3$ or the like or HF, or the like can be employed. In this case, the separation layer 302 is not necessarily used. Further, separation can be performed as follows: a metal oxide layer is formed as the separation layer 302 on the side in contact with the first insulating layer 104 and is weakened by crystallization, and a portion of the separation layer 302 is removed by a solution or by etching using a halogen fluoride gas such as $NF_3$, $BrF_3$, or $ClF_3$; thus, separation can occur in the weakened metal oxide layer.

Alternatively, it is also possible that a groove to expose the separation layer 302 is formed by laser irradiation, by etching using a gas, a solution or the like, or with a sharp knife or a scalpel, so that the element formation layer 304 can be separated from the substrate 300, for example at the interface between the separation layer 302 and the first insulating layer 104 serving as a protective layer, since the groove triggers the separation. For example, as a separation method, mechanical force (a separation process with a human hand or with a gripper, a separation process by rotation of a roller, or the like) may be used. Further, a liquid may be dropped into the groove to allow the liquid to be infiltrated into the interface between the separation layer 302 and the first insulating layer 104, which may be followed by the separation of the element formation layer 304 from the separation layer 302. Alternatively, a method can be employed in which a fluoride gas such as $NF_3$, $BrF_3$, or $ClF_3$ is introduced into the groove, and the separation layer is removed by etching with the use of the fluoride gas so that the element formation layer 304 is separated from the substrate 300 having an insulating surface.

Further alternatively, the separation may be performed while pouring a liquid such as water during the separation.

As another separation method, if the separation layer 302 is formed using tungsten, separation can be conducted while the separation layer is being etched by a mixed solution of ammonia water and hydrogen peroxide water.

Figure 4C:
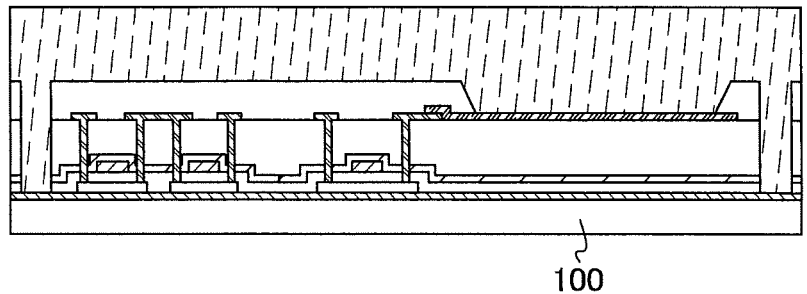

Subsequently, the substrate 100 having flexibility and a light-transmitting property with respect to visible light is bonded to the element formation layer 304 in which part of the separation layer 302 or the first insulating layer 104 is exposed by the separation from the substrate 300, with the use of an adhesive (FIG. 4C).

As a material of the adhesive, various curable adhesives, e.g., a light curable adhesive such as a UV curable adhesive, a reactive curable adhesive, a thermal curable adhesive, and an anaerobic adhesive can be used. As the material of the adhesive, an epoxy resin, an acrylic resin, a silicone resin, a phenol resin, or the like can be used. Note that a structure body in which a fibrous body is impregnated with an organic resin (so-called prepreg) can be used as the substrate 100. In the case of using a prepreg as the substrate 100, the element formation layer 304 and the substrate 100 can be fixed to each other by applying pressure without using an adhesive. At this time, as the organic resin for the structure body, a reactive curable resin, a thermal curable resin, a UV curable resin, or the like which is better cured by additional treatment is preferably used.

Over the substrate 100, the protective film with low water permeability, such as a film containing nitrogen and silicon, e.g., silicon nitride or silicon oxynitride, or a film containing nitrogen and aluminum such as aluminum nitride, may be formed in advance.

Figure 4D:
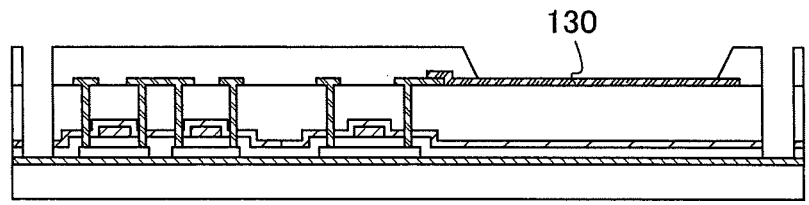

After the substrate 100 is provided, the adhesive sheet 305 is removed to expose the first electrode 130 (FIG. 4D).

Through the above, the element formation layer 304 in which the thin film transistor and up to the first electrode 130 of the light-emitting element are formed can be manufactured over the substrate 100.

Next, the EL layer 134 is formed over the first electrode 130. The EL layer 134 can be formed using either a low molecular material or a high molecular material. Note that, a material forming the EL layer 134 is not limited to a material containing only an organic compound material, and it may partly contain an inorganic compound material. Alternatively, the EL layer 134 may have at least a light-emitting layer, and a single-layer structure that is formed using a single light-emitting layer or a stacked-layer structure including layers having different functions may be used. For example, functional layers such as a hole injection layer, a hole transport layer, a carrier-blocking layer, an electron transport layer, an electron injection layer, and the like can be combined as appropriate in addition to a light-emitting layer. Note that a layer having two or more functions of the functions of the respective layers may be included.

In addition, the EL layer 134 can be formed by either a wet process or a dry process, such as an evaporation method; an inkjet method, a spin-coating method, a dip coating method, or a nozzle printing method.

Next, the second electrode 136 is formed over the EL layer 134. Thus, the light-emitting element 138 in which the first electrode 130, the EL layer 134, and the second electrode 136 are stacked is manufactured. In this manner, the element portion 150 including the thin film transistor 106 and the light-emitting element 138 can be formed. Note that one of the first electrode 130 and the second electrode 136 is used as an anode, and the other is used as a cathode.

In the case of being used as the anode, a material with a high work function is preferably used. For example, a single-layer film such as an indium tin oxide film, an indium tin oxide film containing silicon, a light-transmitting conductive film formed by a sputtering method using a target in which indium oxide is mixed with zinc oxide (ZnO) of 2 to 20 wt %, zinc oxide (ZnO), a conductive oxynitride film containing zinc and aluminum, a titanium nitride film, a chromium film, a tungsten film, a Zn film, or a Pt film; a stacked-layer structure of titanium nitride and a film containing aluminum as its main component; a three-layer structure of a titanium nitride film, a film containing aluminum as its main component, and another titanium nitride film; or the like can be used.

In the case of being used as the cathode, a material with a low work function (Al, Ag, Li, Ca, or an alloy thereof such as MgAg, MgIn, AlLi, $CaF_2$, or calcium nitride) is preferably used. In the case where an electrode used as the cathode is made to transmit light, a stack of a thin metal film with a small thickness and a light-transmitting conductive film (an indium tin oxide film, an indium tin oxide film containing silicon, a light-transmitting conductive film formed by a sputtering method using a target in which indium oxide is mixed with zinc oxide (ZnO) of 2 to 20 wt %, a zinc oxide (ZnO) film, or the like) is preferably used as the electrode.

In this embodiment, the first electrode 130 is used as the anode, and the EL layer 134 has a structure in which a hole injection layer, a hole transport layer, a light-emitting layer, and an electron injection layer are sequentially stacked in that order over the first electrode 130. Various kinds of materials can be used for the light-emitting layer. For example, a fluorescent compound which exhibits fluorescence or a phosphorescent compound which exhibits phosphorescence can be used.

Figure 5A:
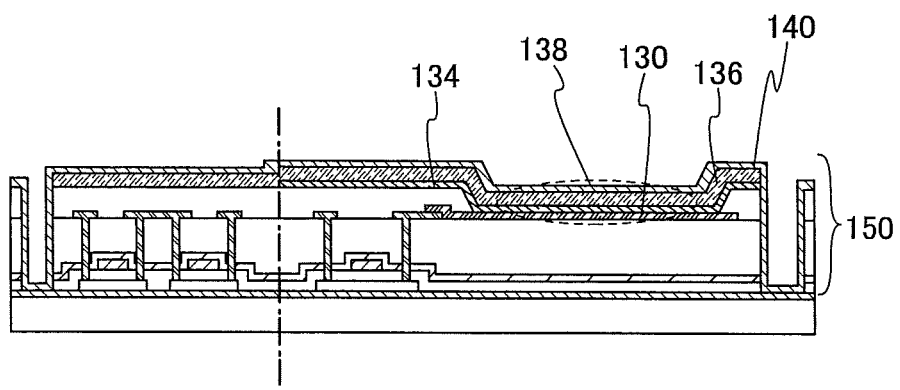
FIGS. 5A and 5B illustrate the method for manufacturing the light-emitting device of an embodiment of the present invention.

Next, the second insulating layer 140 is formed over the second electrode 136 so as to cover the top surface and the side surface of the element portion 150 (FIG. 5A). The second insulating layer 140 serves as a protective layer to prevent moisture from entering the EL layer 134 and prevent damage to the EL layer 134. The second insulating layer 140 is formed also in the groove portion 160, whereby the first insulating layer 104 which is exposed in the groove portion 160 and the second insulating layer 140 come in contact with each other. The first insulating layer 104 and the second insulating layer 140 can be firmly bonded to each other in the groove portion because the first insulating layer 104 and the second insulating layer 140 are each formed using a film containing nitrogen and silicon. Therefore, by the formation of the groove portion surrounding the outer periphery of the element portion 150, the element portion can be firmly sealed.

For example, the second insulating layer 140 is formed as a single layer or a multilayer using, for example, a material containing nitrogen and silicon such as silicon nitride, silicon nitride oxide, or silicon oxynitride; aluminum oxide; or the like by a sputtering method, a plasma CVD method, an application method, a printing method, or the like. Alternatively, the above-described inorganic insulating film and an organic insulating film such as a resin film may be stacked, so that the second insulating layer 140 may be formed. With the second insulating layer, moisture and gas such as oxygen can be prevented from entering the element portion. The second insulating layer 140 serving as a protective layer preferably has a thickness of 10 nm to 1000 nm inclusive, and still preferably 100 nm to 700 nm inclusive.

Subsequently, the resin film 142 is formed over the second insulating layer 140. The resin film 142 can be formed, for example, in such a manner that a composition is applied by an application method and then dried by heating. The resin film 142 is preferably formed using a material with good adhesion to the second insulating layer 140. In particular, in the case where the resin film 142 is formed by an application method, examples of materials used for formation of the resin film 142 include an organic compound such as acrylic resins, polyimide resins, melamine resins, polyester resins, polycarbonate resins, phenol resins, epoxy resins, polyacetal, polyether, polyurethane, polyamide (nylon), furan resins, or diallylphthalate resins; inorganic siloxane polymers including a Si—O—Si bond among compounds including silicon, oxygen, and hydrogen, formed by using a siloxane-polymer-based material typified by silica glass as a starting material; or organic siloxane polymers in which hydrogen bonded with silicon is substituted by an organic group such as methyl or phenyl, typified by alkylsiloxane polymers, alkylsilsesquioxane polymers, silsesquioxane hydride polymers, or alkylsilsesquioxane hydride polymers. Alternatively, as the resin film 142, a structure body in which a fibrous body is impregnated with an organic resin can be used.

Figure 5B:
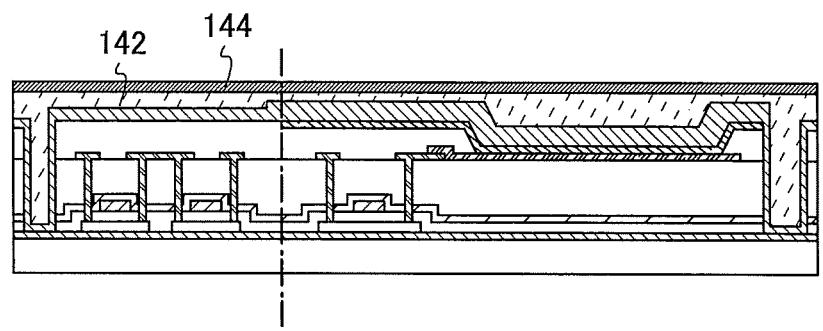

Then, the metal substrate 144 is bonded onto the resin film 142 (FIG. 5B). The metal substrate 144 may be bonded thereto using the above-described adhesive, or the resin film 142 may be used instead of the adhesive. A material for forming the metal substrate is not limited to a particular material, but it is preferable to use aluminum, copper, nickel, an alloy of metal such as an aluminum alloy or stainless steel, or the like. Note that the metal substrate 144 is preferably subjected to baking in vacuum or plasma treatment in order that moisture attached to the surface of the metal substrate 144 can be removed, before the metal substrate 144 is bonded.

The metal substrate 144 can also be bonded using a laminator. For example, there are a method in which a sheet-like adhesive is attached to the metal substrate using a laminator and the metal substrate with the sheet-like adhesive is further bonded to the light-emitting element using a laminator, a method in which an adhesive is printed on the metal substrate by screen printing or the like and the metal substrate with the adhesive is bonded to the light-emitting element using a laminator, and the like. These processes are preferably performed under reduced pressure in order to reduce bubbles between the light-emitting element and the metal substrate.

Through the above-described process, the light-emitting device which is an embodiment of the present invention can be manufactured.

This embodiment describes a method in which up to the first electrode 130 of the light-emitting element of the light-emitting device provided with the thin film transistor is formed over the formation substrate, which is followed by the separation. However, the invention disclosed in this specification is not limited thereto. The separation and transfer may be performed after the light-emitting element 138 is formed (i.e., after the second electrode 136 of the light-emitting element is formed). Alternatively, after only the first insulating layer 104 may be formed over the formation substrate, and separated and transferred to the substrate 100, a thin film transistor or a light-emitting element may be manufactured. Further, in the case where a thin film transistor is not provided, the first electrode 130 of the light-emitting element is formed first over the first insulating layer 104, whereby a light-emitting device can be manufactured in a similar manner. Furthermore, the resin film may be provided over a surface of the metal substrate 144 to protect the metal substrate.

Further, a fibrous body may be included in materials of the substrate 100 and the resin film 142. The fibrous body is a high-strength fiber of an organic compound or an inorganic compound. A high-strength fiber is specifically a fiber with a high modulus of elasticity in tension or a fiber with a high Young's modulus. As a typical example of a high-strength fiber, a polyvinyl alcohol based fiber, a polyester based fiber, a polyamide based fiber, a polyethylene based fiber, an aramid based fiber, a polyparaphenylene benzobisoxazole fiber, a glass fiber, or a carbon fiber can be given. As a glass fiber, there is a glass fiber using E glass, S glass, D glass, Q glass, or the like. These fibers may be used in a state of a woven fabric or a nonwoven fabric, and impregnated with an organic resin, and the organic resin is cured to obtain a structure body. This structure body may be used as the substrate 100. When the structure body including the fibrous body and the organic resin is used as the substrate 100, reliability against bending or damaging due to local pressure can be increased, which is preferable.

In the case where the substrate 100 includes the above-mentioned fibrous body, in order to reduce prevention of light emitted from the light-emitting element to the outside, the fibrous body is preferably a nanofiber with a diameter of less than or equal to 100 nm. Further, refractive indexes of the fibrous body and the organic resin or the adhesive preferably match with each other.

In the light-emitting device of this embodiment, a metal substrate with low water permeability is used as a support of the light-emitting device, so that moisture can be prevented from entering the light-emitting element 138. Thus, a light-emitting device with long lifetime can be realized. Further, the first insulating layer 104 and the second insulating layer 140 which serve as protective layers are in contact with each other in the end portions of the element portion 150, so that moisture and gas such as oxygen can be prevented from entering the light-emitting element 138. Thus, a highly reliable light-emitting device can be realized.

Further, in the light-emitting device of this embodiment, a thin film transistor can be manufactured over a formation substrate with high heat resistance. Therefore, it is possible to use a thin film transistor using a crystalline semiconductor layer of crystalline silicon or the like with high mobility. Thus, a pixel portion and a driver circuit portion using such a thin film transistor can be formed over one substrate, and accordingly, a light-emitting device can be manufactured at low cost.

Note that the structure described in this embodiment can be combined with any of the structures described in other embodiments as appropriate.

Embodiment 3

In this embodiment, a structure of a light-emitting element included in a light-emitting device is specifically described with reference to FIGS. 6A to 6C.

Figure 6A:
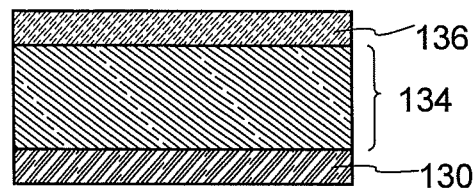
FIGS. 6A to 6C each illustrate an example of a structure of a light-emitting element.

FIG. 6A illustrates an example of the structure of a light-emitting element. In the light-emitting element of FIG. 6A, the EL layer 134 is provided between the first electrode 130 and the second electrode 136. Note that there is no particular limitation on a stacked-layer structure of the EL layer 134 as long as a light-emitting layer is included. The EL layer 134 may be need in an appropriate combination of a light-emitting layer with a layer containing a substance having a high electron transport property, a layer containing a substance having a high hole transport property, a layer containing a substance having a high electron injection property, a layer containing a substance having a high hole injection property, a layer containing a bipolar substance (a substance having high electron transport and hole transport properties), or the like. For example, the EL layer 134 can be formed in an appropriate combination of a hole injection layer, a hole transport layer, a light-emitting layer, an electron transport layer, an electron injection layer, and the like. In this embodiment, a structure is described in which the EL layer 134 includes a hole injection layer, a hole transport layer, a light-emitting layer, and an electron transport layer. Specific materials for forming each of the layers will be given below.

The hole injection layer is a layer that is provided in contact with an anode and contains a substance with a high hole injection property. As a substance with a high hole injection property, molybdenum oxide, vanadium oxide, ruthenium oxide, tungsten oxide, manganese oxide, or the like can be used. In addition, the hole injection layer can also be formed using a phthalocyanine compound such as phthalocyanine (abbreviation: $H_2Pc$) or copper phthalocyanine (CuPC); an aromatic amine compound such as 4,4'-bis[N-(4-diphenylaminophenyl)-N-phenylamino]biphenyl (abbreviation: DPAB) or N,N-bis[4-[bis(3-methylphenyl)amino]phenyl]-N,N'-diphenyl-[1,1'-biphenyl]-4,4'-diamine (abbreviation: DNTPD); a high molecule such as poly(ethylenedioxythiophene)/poly(styrenesulfonic acid) (PEDOT/PSS); or the like.

Alternatively, as the hole injection layer, a composite material of a substance with a high hole transport property containing an acceptor substance can be used. It is to be noted that, by using such a substance with a high hole transport property containing an acceptor substance, a material used to form an electrode may be selected regardless of its work function. In other words, besides a material with a high work function, a material with a low work function can also be used as the first electrode 130. As the acceptor substance, 7,7,8,8-tetracyano-2,3,5,6-tetrafluoroquinodimethane (abbreviation: $F_4$-TCNQ), chloranil, and the like can be given. In addition, a transition metal oxide can be given. In addition, an oxide of metals that belong to Group 4 to Group 8 of the periodic table can be given. Specifically, vanadium oxide, niobium oxide, tantalum oxide, chromium oxide, molybdenum oxide, tungsten oxide, manganese oxide, and rhenium oxide are preferable since their electron-accepting property is high. Among these, molybdenum oxide is especially preferable since it is stable in the air and its hygroscopic property is low and is easily treated.

As the substance having a high hole transport property used for the composite material, any of a variety of compounds such as an aromatic amine compound, a carbazole derivative, aromatic hydrocarbon, or a high molecular compound (e.g., an oligomer, a dendrimer, or a polymer) can be used. The organic compound used for the composite material is preferably an organic compound having a high hole transport property. Specifically, a substance having a hole mobility of $10^{-6}$ $cm^2/Vs$ or higher is preferably used. However, other substances than the above-described materials may also be used as long as the substances have higher hole transport properties than electron transport properties. The organic compounds which can be used for the composite material will be specifically shown below.

As aromatic amine compounds, for example, there are N,N-di(p-tolyl)-N,N-diphenyl-p-phenylenediamine (abbreviation: DTDPPA), 4,4'-bis[N-(4-diphenylaminophenyl)-N-phenylamino]biphenyl (abbreviation: DPAB), N,N'-bis[4-[bis(3-methylphenyl)amino]phenyl]-N,N'-diphenyl-[1,1'-biphenyl]-4,4'-diamine (abbreviation: DNTPD), 1,3,5-tris[N-(4-diphenylaminophenyl)-N-phenylamino]benzene (abbreviation: DPA3B), and the like.

As carbazole derivatives which can be used for the composite material, the following can be given specifically: 3-[4N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2); 3-[N-(1-naphthyl)-N-(9-phenylcarbazol-3-yl)amino]-9-phenylcarbazole (abbreviation: PCzPCN1); and the like.

In addition, examples of the carbazole derivatives which can be used for the composite material include 4,4'-di(N-carbazolyl)biphenyl (abbreviation: CBP), 1,3,5-tris[4-(N-carbazoly)phenyl]benzene (abbreviation: TCPB), 9-[4-(10-phenyl-9-anthryl)phenyl]-9H-carbazole (abbreviation: CzPA), 1,4-bis[4-(N-carbazolyl)phenyl]-2,3,5,6-tetraphenylbenzene, and the like.

Examples of the aromatic hydrocarbon which can be used for the composite material include 2-tert-butyl-9,10-di(2-naphthyl)anthracene (abbreviation: t-BuDNA); 2-tert-butyl-9,10-di(1-naphthyl)anthracene; 9,10-bis(3,5-diphenylphenyl)anthracene (abbreviation: DPPA); 2-tert-butyl-9,10-bis(4-phenylphenyl)anthracene (abbreviation: t-BuDBA); 9,10-di(2-naphthyl)anthracene (abbreviation: DNA); 9,10-diphenylanthracene (abbreviation: DPAnth); 2-tert-butylanthracene (abbreviation: t-BuAnth); 9,10-bis(4-methyl-1-naphthyl)anthracene (abbreviation: DMNA); 2-tert-butyl-9,10-bis[2-(1-naphthyl)phenyl]anthracene; 9,10-bis[2-(1-naphthyl)phenyl]anthracene; 2,3,6,7-tetramethyl-9,10-di(1-naphthyl)anthracene; 2,3,6,7-tetramethyl-9,10-di(2-naphthyl)anthracene; 9,9'-bianthryl; 10,10'-diphenyl-9,9'-bianthryl; 10,10'-bis(2-phenylphenyl)-9,9'-bianthryl; 10,10'-bis[(2,3,4,5,6-pentaphenyl)phenyl]-9,9'-bianthryl; anthracene; tetracene; rubrene; perylene; and 2,5,8,11-tetra(tert-butyl)perylene. Besides those, pentacene, coronene, or the like can also be used. As described above, the aromatic hydrocarbon which has a hole mobility of $1 \times 10^{-6}$ $cm^2/Vs$ or higher and which has 14 to 42 carbon atoms is particularly preferable.

The aromatic hydrocarbon which can be used for the composite material may have a vinyl skeleton. As the aromatic hydrocarbon having a vinyl group, the following are given for example: 4,4'-bis(2,2-diphenylvinyl)biphenyl (abbreviation: DPVBi); 9,10-bis[4-(2,2-diphenylvinyl)phenyl]anthracene (abbreviation: DPVPA); and the like.

Examples of the substance used for the composite material further include high molecular compounds such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl) methacrylamide] (abbreviation: PTPDMA); and poly[N,N-bis(4-butylphenyl)-N,N'-bis(phenyl)benzidine] (abbreviation: Poly-TPD).

The hole transport layer is a layer which contains a substance with a high hole transport property. Examples of the substance having a high hole transport property include aromatic amine compounds such as 4,4'-bis[N-(1-naphthyl)-N-phenylamino] biphenyl (abbreviation: NPB), N,N'-bis(3-methylphenyl)-N,N'-diphenyl-[1,1'-biphenyl]-4,4'-diamine (abbreviation: TPD), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), 4,4'-bis[N-(spiro-9,9'-bifluoren-2-yl)-N-phenylamino]biphenyl (abbreviation: BSPB), and the like. The substances mentioned here are mainly ones which have a hole mobility of $10^{-6}$ $cm^2/Vs$ or higher. However, other substances than the above described materials may also be used as long as the substances have higher hole transport properties than electron transport properties. The layer containing a substance with a high hole transport property is not limited to a single layer, and two or more layers containing the aforementioned substances may be stacked.

Further, a high molecular compound such as poly(N-vinyl-carbazole) (abbreviation: PVK) or poly(-vinyltriphenyl-amine) (abbreviation: PVTPA) can also be used for the hole transport layer.

The light-emitting layer is a layer containing a light-emitting substance. The light-emitting layer may be either a so-called light-emitting layer of a single film including an emission center material as its main component or a so-called light-emitting layer of a host-guest type in which an emission center material is dispersed in a host material.

There is no particular limitation on the light-emitting center substance that is used, and known fluorescent materials or phosphorescent materials can be used. As fluorescent materials, for example, there are N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), or another material with an emission wavelength of 450 nm or greater, such as 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra-tert-butylperylene (abbreviation: TBP), 4-(10-phenyl-9-anthryl)-4'-(9-phenyl-9H-carbazol-3-yl)triphenylamine (abbreviation: PCBAPA), N,N'''-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N'',N'',N''',N'''-octaphenyldibenzo[g,p]chrysene-2,7,10,15-tetramine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), or 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM). As phosphorescent materials, for example, in addition to bis[2-(4',6'-difluorophenyl)pyridinato-N,$C^{2'}$]iridium(III)tetrakis(1-pyrazolyl)borate (abbreviation: FIr6), there are phosphorescent materials with an emission wavelength in the range of 470 nm to 500 nm, such as bis[2-(4',6'-difluorophenyppyridinato-N,$C^{2'}$]iridium(III)picolinate (abbreviation: FIrpic), bis[2-(3',5'-bistrifluoromethylphenyl)pyridinato-N,$C^{2'}$]iridium (III)picolinate (abbreviation: Ir($CF_3$ppy)$_2$(pic)), and bis[2-(4',6'-difluorophenyl)pyridinato-N,$C^{2'}$]iridium(III) acetylacetonate (abbreviation: FIracac); phosphorescent materials with an emission wavelength of greater than or equal to 500 nm (materials which emit green light), such as tris(2-phenylpyridinato)iridium(III) (abbreviation: Ir(ppy)$_3$), bis(2-phenylpyridinato)iridium(III)acetylacetonate (abbreviation: Ir(ppy)$_2$(acac)), tris(acetylacetonato)(monophenanthroline)terbium(III) (abbreviation: Tb(acac)$_3$(Phen)), bis(benzo[h]quinolinato)iridium(III)acetylacetonate (abbreviation: Ir(bzq)$_2$(acac)), bis(2,4-diphenyl-1,3-oxazolato-N,$C^{2'}$)iridium(III)acetylacetonate (abbreviation: Ir(dpo)$_2$(acac)), bis[2-(4'-perfluorophenylphenyl)pyridinato]iridium(III)acetylacetonate (abbreviation: Ir(p-PF-ph)$_2$(acac)), bis(2-phenylbenzothiazolato-N,$C^{2'}$)iridium(III) acetylacetonate (abbreviation: Ir(bt)$_2$(acac)), bis[2-(2'-benzo[4,5-a]thienyl)pyridinato-N,$C^{3'}$]iridium(III)acetylacetonate (abbreviation: Ir(btp)$_2$(acac)), bis(1-phenylisoquinolinato-N,$C^{2'}$)iridium(III)acetylacetonate (abbreviation: Ir(piq)$_2$(acac)), (acetylacetonato)bis[2,3-bis(4-fluorophenyl)quinoxalinato]iridium(III) (abbreviation: Ir(Fdpq)$_2$(acac)), (acetylacetonato)bis(2,3,5-triphenylpyrazinato)iridium(III) (abbreviation: Ir(tppr)$_2$(acac)), 2,3,7,8,12,13,17,18-octaethyl-21H,23H-porphyrinatoplatinum(II) (abbreviation: PtOEP), tris(1,3-diphenyl-1,3-propanedionato)(monophenanthroline)europium(III) (abbreviation: Eu(DBM)$_3$(Phen)), and tris[1-(2-thenoyl)-3,3,3-trifluoroacetonato](monophenanthroline)europium(III) (Eu(TTA)$_3$(Phen)); and the like. The light-emitting center substances can be selected from the above-mentioned materials or other known materials in consideration of the emission color of each of the light-emitting elements.

When the host material is used, for example, the following can be given: metal complexes such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2''-(1,3,5-benzenetriyl)tris(1-phenyl-1H-benzimidazole) (abbreviation: TPBI), bathophenanthroline (abbreviation: BPhen), bathocuproine (abbreviation: BCP), and 9-[4-(5-phenyl-1,3,4-oxadiazol-2-yl)phenyl]-9H-carbazole (abbreviation: CO11); and aromatic amine compounds such as NPB (or a-NPD), TPD, and BSPB. In addition, condensed polycyclic aromatic compounds such as anthracene derivatives, phenanthrene derivatives, pyrene derivatives, chrysene derivatives, and dibenzo[g,p]chrysene derivatives are given. Specific examples of the condensed polycyclic aromatic compound include 9,10-diphenylanthracene (abbreviation: DPAnth), N,N-diphenyl-9-[4-(10-phenyl-9-anthryl)phenyl]-9H-carbazol-3-amine (abbreviation: CzAlPA), 4-(10-phenyl-9-anthryl)triphenylamine (abbreviation: DPhPA), 4-(9H-carbazol-9-yl)-4'-(10-phenyl-9-anthryl)triphenylamine (abbreviation: YGAPA), N,9-diphenyl-N-[4-(10-phenyl-9- anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N,9-diphenyl-N-(9,10-diphenyl-2-anthryl)-9H-carbazol-3-amine (abbreviation: 2PCAPA), 6,12-dimethoxy-5,11-diphenylchrysene, N,N,N',N',N'',N'',N''',N'''-octaphenyldibenzo[g,p]chrysene-2,7,10,15-tetraamine (abbreviation: DBC1), 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 3,3',3''-(benzene-1,3,5-triyl) tripyrene (abbreviation: TPB3), and the like. From these materials or other known materials, a material may be selected which has a larger energy gap (or a triplet energy if the material emits phosphorescence) than an emission center material dispersed in the material and which has a transport property as needed.

The electron transport layer is a layer that contains a substance with a high electron transport property. For example, a layer containing a metal complex having a quinoline skeleton or a benzoquinoline skeleton, such as tris(8-quinolinolato) aluminum (abbreviation: Alq), tris(4-methyl-8-quinolinolato)aluminum (abbreviation: Almq$_3$), bis(10-hydroxybenzo [h]quinolinato)beryllium (abbreviation: BeBq$_2$), or bis(2-methyl-8-quinolinolato)(4-phenylphenolato)aluminum (abbreviation: BAlq), or the like can be used. Alternatively, a metal complex having an oxazole-based or triazole-based ligand, such as bis[2-(2-hydroxyphenyl)benzoxazolato]zinc (abbreviation: Zn(BOX)$_2$) or bis[2-(2-hydroxyphenyl)benzothiazolato]zinc (abbreviation: Zn(BTZ)$_2$), or the like can be used. Besides the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can also be used. The substances mentioned here are mainly ones that have an electron mobility of $10^{-6}$ cm$^2$/Vs or higher. The electron transport layer may be formed using other materials than those described above as long as the materials have electron transport properties higher than hole transport properties.

Furthermore, the electron transport layer is not limited to a single layer, and two or more layers made of the aforementioned substances may be stacked.

Further, a layer for controlling transport of electron carriers may be provided between the electron transport layer and the light-emitting layer. Specifically, the layer for controlling transport of electron carriers is a layer formed by adding a small amount of substance having a high electron trapping property to the material having a high electron transport property as described above, so that carrier balance can be adjusted by controlling a transport of the electron carriers. Such a structure is very effective in suppressing a problem (such as shortening of element lifetime) caused when electrons pass through the light-emitting layer.

Further, an electron injection layer may be provided so as to be in contact with the electrode functioning as a cathode. As the electron injection layer, an alkali metal, an alkaline earth metal, or a compound thereof such as lithium fluoride (LiF), cesium fluoride (CsF), or calcium fluoride (CaF$_2$) may be used. For example, a layer of a material having an electron transport property containing an alkali metal, an alkaline earth metal, or a compound thereof, such as an Alq layer which contains magnesium (Mg), may be used. When a layer made of a substance having electron transport properties, in which an alkali metal or an alkaline earth metal is included, is used as the electron injection layer, electrons are efficiently injected from the second electrode 136, which is preferable.

When the second electrode 136 of the light-emitting element is used as a cathode, a metal, an alloy, an electrically conductive compound, a mixture thereof, or the like having a low work function (specifically, a work function of 3.8 eV or lower), can be used as a substance for the second electrode 136. As a typical example of such a cathode material, an element belonging to Group 1 or Group 2 of the periodic table, i.e., an alkali metal such as lithium (Li) or cesium (Cs), or an alkaline earth metal such as magnesium (Mg), calcium (Ca), or strontium (Sr); an alloy containing any of these (such as MgAg or AlLi); a rare earth metal such as europium (Eu) or ytterbium (Yb); an alloy containing such a rare earth metal; or the like can be used. However, when the electron injection layer is provided between the cathode and the electron transport layer, any of a variety of conductive materials such as Al, Ag, ITO, indium oxide-tin oxide containing silicon or silicon oxide, and the like can be used regardless of its work function as the cathode. These conductive materials can be formed by a sputtering method, an inkjet method, a spin-coating method, or the like.

It is preferable that, when the second electrode 136 is used as an anode, the second electrode 136 be formed using a metal, an alloy, a conductive compound, a mixture thereof, or the like having a high work function (specifically, a work function of 4.0 eV or higher). In particular, examples thereof include indium oxide-tin oxide (ITO: indium tin oxide), indium oxide-tin oxide containing silicon or silicon oxide, indium oxide-zinc oxide (IZO: indium zinc oxide), indium oxide containing tungsten oxide and zinc oxide (IWZO), and the like. Films of these conductive metal oxides are usually formed by sputtering; however, a sol-gel method or the like may also be used. For example, indium oxide-zinc oxide (IZO) can be formed by a sputtering method using indium oxide into which zinc oxide of 1 to 20 wt % is added, as a target. Moreover, indium oxide (IWZO) including tungsten oxide and zinc oxide can be formed by a sputtering method using a target in which 0.5 to 5 wt % of tungsten oxide and 0.1 to 1 wt % of zinc oxide with respect to indium oxide are included. In addition, gold (Au), platinum (Pt), nickel (Ni), tungsten (W), chromium (Cr), molybdenum (Mo), iron (Fe), cobalt (Co), copper (Cu), palladium (Pd), a nitride of a metal material (such as titanium nitride), or the like can be used. By forming the above-mentioned composite material so as to be in contact with the anode, a material for the electrode can be selected regardless of its work function.

Figure 6B:
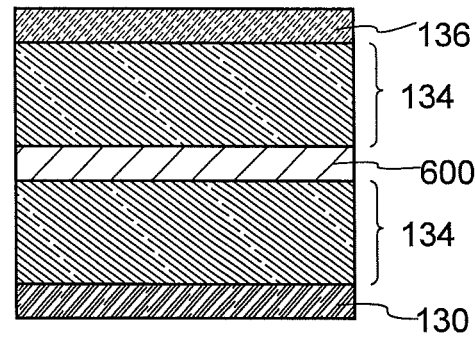

Note that a plurality of the above-mentioned EL layers 134 may be stacked between the first electrode 130 and the second electrode 136 as illustrated in FIG. 6B. In this case, a charge generation layer 600 is preferably provided between the EL layers 134 which are stacked. The charge generation layer 600 can be formed by using the above-mentioned composite material. Further, the charge generation layer 600 may have a stacked-layer structure including a layer containing the composite material and a layer containing another material. In this case, as the layer containing another material, a layer containing an electron donating substance and a substance with a high electron transport property, a layer comprising a transparent conductive film, and the like can be used. As for a light-emitting element having such a structure, problems such as energy transfer and quenching occur with difficulty, and a light-emitting element which has both high light emission efficiency and long lifetime can be easily obtained due to expansion in the choice of materials. Moreover, a light-emitting element which provides phosphorescence from one of the EL layers and fluorescence from the other of the EL layers can be readily obtained. Note that this structure can be combined with the above-mentioned structures of the EL layer.

Next, the case where three or more EL layers are stacked between the first electrode and the second electrode will be described. As illustrated in FIG. 6C, in the case where n (n is a natural number of three or more) EL layers 134 are stacked, the charge generation layer 600 is provided between an m-th (m is a natural number, 1≤m≤n−1) EL layer and an (m+1)-th EL layer.

Note that the charge generation layer 600 has a function of injecting holes to one EL layer 134 which is formed in contact with one surface of the charge generation layer 600 and a function of injecting electrons to the other EL layer 134 which is formed in contact with the other surface of the charge generation layer 600, when voltage is applied to the first electrode 130 and the second electrode 136.

The charge generation layer 600 may be formed using a composite material of an organic compound and a metal oxide, a metal oxide, or a composite material of an organic compound and an alkali metal, an alkaline earth metal, or a compound thereof; alternatively, these materials may be combined as appropriate. The composite material of an organic compound and a metal oxide includes, for example, an organic compound and a metal oxide such as $V_2O_5$, $MoO_3$, or $WO_3$. As the organic compound, various compounds such as an aromatic amine compound, a carbazole derivative, aromatic hydrocarbon, and a high molecular compound (oligomer, dendrimer, polymer, or the like) can be used. As the organic compound, it is preferable to use the organic compound which has a hole transport property and has a hole mobility of $10^{-6}$ $cm^2/Vs$ or higher. However, other substances than the above described materials may also be used as long as the substances have higher hole transport properties than electron transport properties. These materials used for the charge generation layer 600 are excellent in carrier-injecting property and carrier-transporting property, and thus, a light-emitting element can be driven with low current and with low voltage.

Figure 6C:
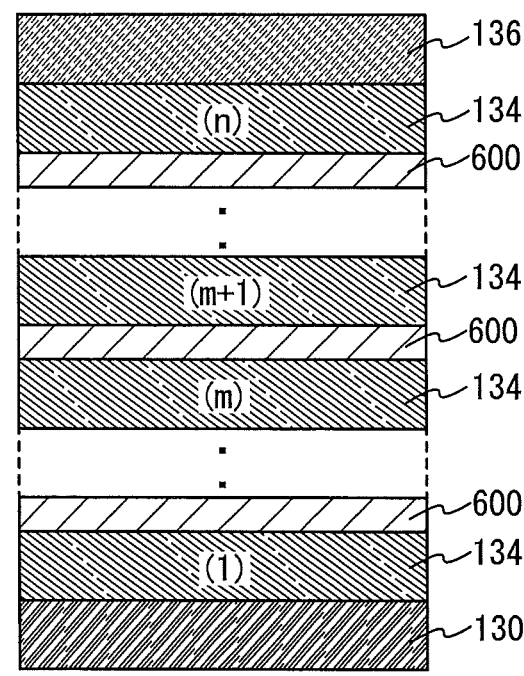

As in the structure illustrated in FIG. 6B or FIG. 6C, by arranging a plurality of EL layers to be partitioned from each other with a charge generation layer between a pair of electrodes, light emission in a high luminance region can be achieved with current density kept low. Since current density can be kept low, a light-emitting element having long lifetime can be realized. Further, by forming EL layers to emit light of different colors from each other, a light-emitting element as a whole can provide light emission of a desired color. For example, by forming a light-emitting element having two EL layers such that the emission color of the first EL layer and the emission color of the second EL layer are complementary colors, the light-emitting element can provide white light emission as a whole. Note that the word "complementary" means color relationship in which an achromatic color is obtained when colors are mixed. That is, when lights obtained from substances, which emit complementary colored light each other are mixed, white light emission can be obtained. Further, the same can be applied to a light-emitting element having three EL layers. For example, the light-emitting element as a whole can provide white light emission when the emission color of the first EL layer is red, the emission color of the second EL layer is green, and the emission color of the third EL layer is blue.

Note that the structure described in this embodiment can be combined with any of the structures described in other embodiments as appropriate.

Embodiment 4

Figure 7A:
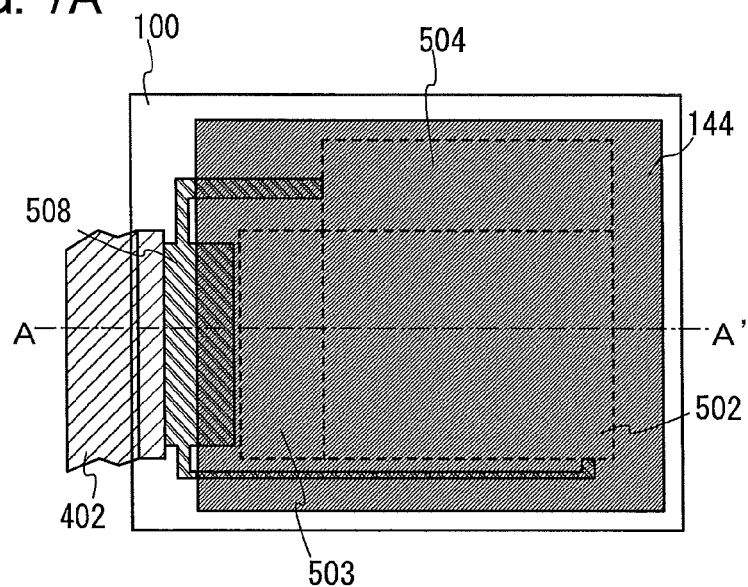
FIGS. 7A and 7B illustrate an example of a structure of a light-emitting device of an embodiment of the present invention.
Figure 7B:
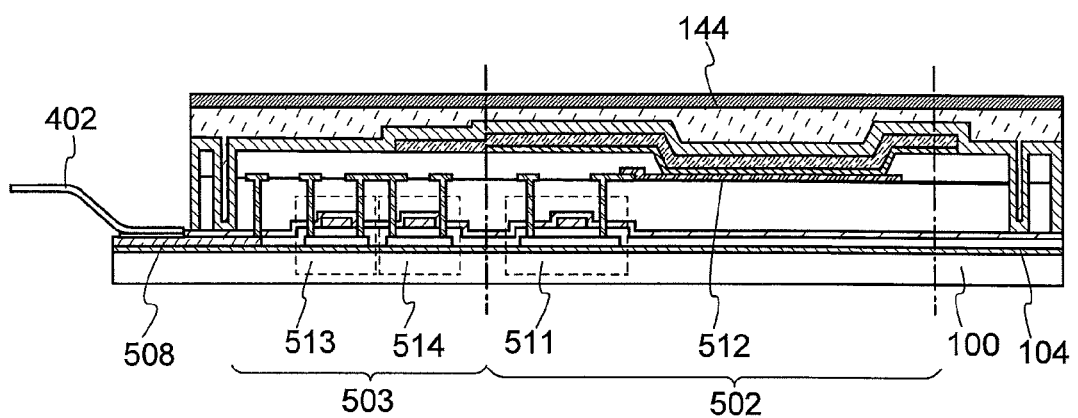

In this embodiment, a modular light-emitting device to which an FPC is connected will be described with reference to FIGS. 7A and 7B. FIG. 7A is a top view illustrating the light-emitting device manufactured by the manufacturing method described in Embodiment 2 as an example. FIG. 7B is a cross-sectional view taken along a line A-A' of FIG. 7A.

In FIG. 7A, a first insulating layer is provided over the substrate 100 having flexibility and a light-transmitting property with respect to visible light. In addition, a pixel portion 502, a source side driver circuit 504, and a gate side driver circuit 503 are formed over the first insulating layer. The pixel portion and the driver circuits can be obtained in accordance with Embodiment 2. Reference numeral 144 denotes a metal substrate which is bonded onto the pixel portion and the driver circuit portion.

Reference numeral 508 denotes a wiring for transmitting a signal inputted to the source side driver circuit 504 and the gate side driver circuit 503, and the wiring 508 receives a video signal, a clock signal, a start signal, a reset signal, and the like from a flexible printed circuit (FPC) 402 which is to be an external input terminal. The wiring 508 can be formed in the same process as that of forming the gate electrodes of the thin film transistors provided in the pixel portion and the driver circuit portion. Note that a structure in which a printed wiring board (PWB) is attached to the FPC 402 illustrated in FIGS. 7A and 7B may be used. The light-emitting device in this specification includes, in its category, not only the light-emitting device itself but also the light-emitting device provided with the FPC or the PWB.

Next, the cross-sectional structure is described with reference to FIG. 7B. The first insulating layer 104 is provided over the substrate 100, and the pixel portion 502 and the gate side deriver circuit 503 are formed over the first insulating layer 104. The pixel portion 502 includes a plurality of pixels each including a current control TFT 511 and a first pixel electrode 512 electrically connected to a drain of the current control TFT 511. Further, the gate side driver circuit 503 is formed using a CMOS circuit in which an n-channel TFT 513 and a p-channel TFT 514 are combined.

Note that the connection form of the FPC is not limited to the structure illustrated in FIGS. 7A and 7B. For example, a through wiring can be provided in a portion to be connected to the wiring 508 from the substrate 100 side, and, with the use of the through wiring, the connection to the FPC can be realized. For example, a through-hole which reaches the wiring 508 is formed in the substrate 100 and the first insulating layer 104 with the use of a laser, a drill, a punching needle, or the like, and a conductive resin is provided in the through-hole by screen printing or an inkjet method, whereby the through wiring can be formed. The conductive resin refers to a resin in which a conductive particle with a grain size of several tens of micrometers or less is dissolved or resolved in an organic resin.

For the conductive particle, a conductive paste containing any of metal elements of copper (Cu), silver (Ag), nickel (Ni), gold (Au), platinum (Pt), palladium (Pd), tantalum (Ta), molybdenum (Mo), or titanium (Ti) can be used, for example. In addition, as an organic resin contained in the conductive resin, one or more of organic resins functioning as a binder, a solvent, a dispersing agent, and a coating material for the metal particle can be used. Typically, an organic resin such as an epoxy resin, a phenol resin, or a silicone resin can be used.

In the case where a structure body in which a fibrous body is impregnated with an organic resin is used as the substrate 100, the through wiring can be formed in the following manner. A conductive resin is arranged onto a predetermined position of the structure body. Part of the organic resin in the structure body is melted due to a reaction between the organic resin in the structure body and the organic resin included in the conductive resin, so that the structure body is penetrated with a metal particle included in the conductive resin. In such a manner, the through wiring can be formed.

In this manner, the modular light-emitting device to which the FPC 402 is connected can be obtained.

Note that the structure described in this embodiment can be combined with any of the structures described in other embodiments as appropriate.

Embodiment 5

In this embodiment, an electronic device and a lighting device each including the light-emitting device described in the above embodiment in part thereof will be described.

As examples of the electronic device including any of the light-emitting devices described in Embodiments 1 to 4, the following can be given: video cameras, digital cameras, goggle type displays, navigation systems, audio replay devices (e.g., car audio systems and audio systems), computers, game machines, portable information terminals (e.g., mobile computers, cellular phones, portable game machines, and electronic book readers), image replay devices in which a recording medium is provided (specifically, devices that are capable of replaying recording media such as digital versatile discs (DVDs) and equipped with a display device that can display an image), and the like.

Figure 8A:
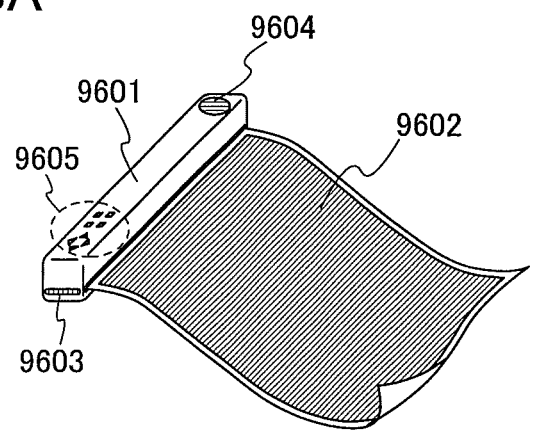
FIGS. 8A and 8B each illustrate an application example of a light-emitting device of an embodiment of the present invention.

For example, FIG. 8A illustrates a flexible display which includes a main body 9601, a display portion 9602, an insert portion of an external memory 9603, a speaker portion 9604, operation keys 9605, and the like. The main body 9601 may be provided with an antenna for receiving a television broadcast, an external input terminal, an external output terminal, a battery, and the like. In this display, the display portion 9602 is manufactured using any of the light-emitting devices described in Embodiments 1 to 4. The flexible display portion 9602 can be rolled up and stored in the main body 9601 and is suitable for being carried. The display mounted with the light-emitting device which is flexible, has long lifetime, and can easily be manufactured allows the display portion 9602 to be suitable for being carried along and be lightweight, and further, the display can be a relatively inexpensive product with long lifetime.

Figure 8B:
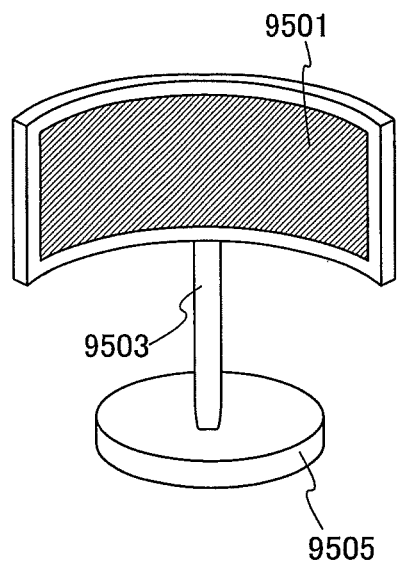

The light-emitting device relating to an embodiment of the present invention can be a passive matrix light-emitting device, and the light-emitting device can be used for a lighting device. For example, FIG. 8B is a desk lamp including a lighting portion 9501, a support 9503, a support base 9505, and the like. The lighting portion 9501 is formed using any of the light-emitting devices described in the above embodiments. Because the lighting portion 9501 is formed using a flexible light-emitting device, the lighting device described in this embodiment can be a lighting device having a curved surface or a lighting device having a flexible lighting portion. The use of a flexible light-emitting device for a lighting device as above not only improves the degree of freedom in design of the lighting device but also enables the lighting device to be mounted onto a portion having a curved surface, such as the ceiling of a car. Further, with the use of a flexible light-emitting device, a lighting device can be manufactured in which its lighting portion can be rolled up and stored when not in use, like for example, a roller screen type lighting device. Note that the term "lighting device" also includes, in its category, ceiling lights (ceiling-fixed lighting devices), wall lights (wall-hanging lighting devices), and the like.

Note that the lighting device of this embodiment which is manufactured by using any of the above embodiments can be a highly reliable lighting device.

In the above-described manner, an electronic device or a lighting device can be obtained by using any of the light-emitting devices described in the above embodiments. The application range of the light-emitting device is so wide that the light-emitting device can be applied to electronic devices or lighting devices in all fields, without limitation to the structure illustrated in FIG. 8A or FIG. 8B.

Note that the structure described in this embodiment can be combined with any of the structures described in other embodiments as appropriate.

This application is based on Japanese Patent Application serial no. 2009-157742 filed with Japan Patent Office on Jul. 2, in 2009, the entire contents of which are hereby incorporated by reference.

What is claimed is:

1. A light-emitting device comprising:
   a substrate having flexibility and a light-transmitting property with respect to visible light;
   a first insulating layer over the substrate;
   an element portion over the first insulating layer, wherein the element portion comprises a light-emitting element and a switching element for applying a potential to the light-emitting element;
   a second insulating layer covering a side surface and a top surface of the element portion;
   a sealing material over the second insulating layer, wherein the sealing material surrounds an outer periphery of the element portion; and
   a metal substrate overlapping with the light-emitting element,
   wherein the first insulating layer and the second insulating layer are in direct contact with each other in a region which is in the outer periphery of the element portion and is surrounded by the sealing material,
   wherein the switching element comprises a semiconductor layer, and
   wherein the semiconductor layer is totally over the first insulating layer.

2. The light-emitting device according to claim 1, wherein the substrate comprises a fibrous body impregnated with an organic resin.

3. The light-emitting device according to claim 1, wherein the first insulating layer and the second insulating layer are in contact with each other to surround the element portion.

4. The light-emitting device according to claim 1, wherein another resin film is provided over the metal substrate.

5. The light-emitting device according to claim 1, wherein the metal substrate comprises any one of stainless steel, aluminum, copper, nickel, and an aluminum alloy.

6. The light-emitting device according to claim 1, wherein the metal substrate has a thickness of 10 μm to 200 μm inclusive.

7. An electronic device comprising the light-emitting device according to claim 1 in a display portion.

8. A lighting device comprising the light-emitting device according to claim 1.

9. The light-emitting device according to claim 1, wherein the first insulating layer comprises any one of silicon nitride, silicon oxynitride and silicon nitride oxide.

10. The light-emitting device according to claim 1, wherein the second insulating layer comprises any one of silicon nitride, silicon nitride oxide, silicon oxynitride and aluminum oxide.

11. The light-emitting device according to claim 1, wherein the metal substrate has flexibility.

12. The light-emitting device according to claim 1, wherein the metal substrate faces a whole area of the element portion.

13. The light-emitting device according to claim 1, wherein the light-emitting element comprises EL layers which are stacked with each other.

14. A flexible display comprising the light-emitting device according to claim 1 in a display portion.

15. A light-emitting device comprising:
a first layer having flexibility and a light-transmitting property with respect to visible light, the first layer comprising an aramid;
a first insulating layer over the first layer;
an element portion over the first insulating layer, wherein the element portion comprises a light-emitting element and a switching element for applying a potential to the light-emitting element;
a second insulating layer covering a side surface and a top surface of the element portion;
a third insulating layer surrounding an outer periphery of the light-emitting element; and
a second layer facing the first layer, the second layer comprising an aramid,
wherein the first insulating layer and the second insulating layer are in direct contact with each other in a region which is in the outer periphery of the light-emitting element and is surrounded by the third insulating layer,
wherein the switching element comprises a semiconductor layer, and
wherein the semiconductor layer is totally over the first insulating layer.

16. The light-emitting device according to claim 15, wherein the first insulating layer and the second insulating layer are in contact with each other to surround the light-emitting element.

17. The light-emitting device according to claim 15, wherein a part of the third insulating layer is located below the first layer.

18. The light-emitting device according to claim 15, wherein a fourth insulating layer is provided between the first insulating layer and the second insulating layer, and a part of the second insulating layer is located in an opening of the fourth insulating layer.

19. The light-emitting device according to claim 15, wherein the light-emitting element comprises EL layers which are stacked with each other.

20. A flexible display comprising the light-emitting device according to claim 15 in a display portion.

21. A light-emitting device comprising:
a first layer comprising an aramid;
a first insulating layer over the first layer;
a semiconductor layer totally over the first insulating layer;
a first electrode over the first insulating layer;
a second insulating layer over the first electrode;
an electroluminescent layer over the first electrode and the second insulating layer;
a second electrode over the electroluminescent layer;
a third insulating layer over the second electrode;
a fourth insulating layer outside the first layer and facing to a side surface of the first insulating layer and a side surface of the third insulating layer; and
a second layer facing the first layer, the second layer comprising an aramid,
wherein the first insulating layer and the third insulating layer are in direct contact with each other, and the third insulating layer is in contact with a side surface of the second insulating layer.

22. The light-emitting device according to claim 21, wherein the first insulating layer and the third insulating layer are in contact with each other to surround the first electrode, the second insulating layer, the electroluminescent layer, and the second electrode.

23. The light-emitting device according to claim 21, wherein a part of the fourth insulating layer is located below the first layer.

24. The light-emitting device according to claim 21, wherein a part of the third insulating layer is located in an opening of the second insulating layer.

25. The light-emitting device according to claim 21, wherein a charge generation layer and another electroluminescent layer are provided over the electroluminescent layer.

26. A flexible display comprising the light-emitting device according to claim 21 in a display portion.

* * * * *